US009978600B2

(12) United States Patent
Price et al.

(10) Patent No.: US 9,978,600 B2
(45) Date of Patent: May 22, 2018

(54) SEMICONDUCTOR ELECTRONIC DEVICES AND METHODS OF MANUFACTURE THEREOF

(71) Applicant: Pragmatic Printing Ltd., Sedgefield, Durham (GB)

(72) Inventors: Richard Price, Manchester (GB); Catherine Ramsdale, Cambridge (GB)

(73) Assignee: Pragmatic Printing Ltd., Sedgefield Durham (GB)

( * ) Notice: Subject to any disclaimer, the term of this patent is extended or adjusted under 35 U.S.C. 154(b) by 0 days. days.

(21) Appl. No.: 15/369,159

(22) Filed: Dec. 5, 2016

(65) Prior Publication Data

US 2017/0125249 A1   May 4, 2017

Related U.S. Application Data

(63) Continuation of application No. 14/008,009, filed as application No. PCT/GB2012/050727 on Mar. 30, 2012, now Pat. No. 9,530,649.

(30) Foreign Application Priority Data

Mar. 30, 2011  (GB) .................................. 1105380.8
Oct. 7, 2011  (GB) .................................. 1117365.5

(51) Int. Cl.
*H01L 21/268* (2006.01)
*H01L 29/786* (2006.01)
(Continued)

(52) U.S. Cl.
CPC .......... *H01L 21/268* (2013.01); *H01L 21/428* (2013.01); *H01L 29/78618* (2013.01);
(Continued)

(58) Field of Classification Search
CPC ..... H01L 21/268; H01L 29/66; H01L 29/786; H01L 29/78618; H01L 51/0027;
(Continued)

(56) References Cited

U.S. PATENT DOCUMENTS 5,403,772 A   4/1995 Zhang et al.
6,277,679 B1   8/2001 Ohtani
(Continued)

FOREIGN PATENT DOCUMENTS

CN   1603924 A   4/2005
EP   0691688 A2   10/1996
(Continued)

OTHER PUBLICATIONS

International Search Report for corresponding PCT Application No. PCT/GB2012/050727, dated Jul. 3, 2012.
(Continued)

*Primary Examiner* — Selim Ahmed
(74) *Attorney, Agent, or Firm* — Reza Mollaaghababa; Thomas J. Engellenner; Pepper Hamilton LLP

(57) ABSTRACT

A method of manufacturing an electronic device comprises: providing a layer of semiconductor material comprising a first portion, a second portion, and a third portion, the third portion connecting the first portion to the second portion and providing a semiconductive channel for electrical current flow between the first and second portions; providing a gate terminal arranged with respect to said third portion such that a voltage may be applied to the gate terminal to control an electrical conductivity of said channel; and processing at least one of the first and second portions so as to have an electrical conductivity greater than an electrical conductivity of the channel when no voltage is applied to the gate terminal. In certain embodiments, the processing comprises exposing at least one of the first and second portions to
(Continued)

electromagnetic radiation. The first and second portions may be laser annealed to increase their conductivities.

27 Claims, 30 Drawing Sheets

(51) Int. Cl.
*H01L 51/00* (2006.01)
*H01L 21/428* (2006.01)
*H01L 29/66* (2006.01)
*H01L 51/10* (2006.01)

(52) U.S. Cl.
CPC ...... *H01L 51/0027* (2013.01); *H01L 29/6675* (2013.01); *H01L 29/66772* (2013.01); *H01L 29/66969* (2013.01); *H01L 29/7869* (2013.01); *H01L 51/105* (2013.01)

(58) Field of Classification Search
CPC . H01L 21/428; H01L 51/105; H01L 29/6675; H01L 29/66969; H01L 29/7869; H01L 29/66772
USPC ............... 257/57, 66; 438/104, 151, 795
See application file for complete search history.

(56) References Cited

U.S. PATENT DOCUMENTS

| | | |
|---|---|---|
| 6,281,055 B1 | 8/2001 | Yang |
| 6,475,872 B1 | 11/2002 | Jung |
| 2003/0124826 A1 | 7/2003 | Kim |
| 2004/0048422 A1* | 3/2004 | Kurosawa ........... H01L 27/1237 438/151 |
| 2004/0134417 A1 | 7/2004 | Kim |
| 2004/0248348 A1 | 12/2004 | Rausch et al. |
| 2004/0266080 A1* | 12/2004 | Jyumonji ........... B23K 26/0648 438/166 |
| 2005/0158900 A1 | 7/2005 | Lee et al. |
| 2006/0006429 A1 | 1/2006 | Iga |
| 2006/0197092 A1* | 9/2006 | Hoffman ........... H01L 29/66969 257/72 |
| 2006/0199305 A1 | 9/2006 | Chen et al. |
| 2007/0262451 A1 | 11/2007 | Rachmady et al. |
| 2008/0113499 A1 | 5/2008 | Makiyama et al. |
| 2008/0164526 A1 | 7/2008 | Wang et al. |
| 2009/0189204 A1* | 7/2009 | Heitzinger ........ H01L 29/66757 257/288 |
| 2009/0283763 A1 | 11/2009 | Park et al. |
| 2010/0117071 A1 | 5/2010 | Inoue et al. |
| 2010/0177125 A1* | 7/2010 | Miwa ................... G09G 3/3233 345/690 |
| 2011/0006297 A1 | 1/2011 | Inoue et al. |
| 2011/0042667 A1 | 2/2011 | Kawamura et al. |
| 2011/0062431 A1 | 3/2011 | Shieh et al. |

FOREIGN PATENT DOCUMENTS

| | | |
|---|---|---|
| EP | 2075831 A3 | 9/2010 |
| GB | 2479150 A | 10/2011 |
| JP | 0878699 A | 3/1996 |

OTHER PUBLICATIONS

International Preliminary Report on Patentability, dated Oct. 1, 2013.
Search Report of GB 1105380.8, dated Jul. 14, 2011.
Search Report of GB 1117365.5, dated Sep. 6, 2012.
Examination Report of GB 1117365.5, dated Sep. 29, 2014.
Examination Report of GB 1105380.8, dated Nov. 14, 2014.
European Examination Report for corresponding EP Application No. 12719435.5, dated Mar. 18, 2015.
Examination Report received in Application No. GB1105380.8 dated May 7, 2015; 6 pages.
Examination Report received in Application No. GB1117365.5 dated May 7, 2015; 6 pages.

* cited by examiner

SEMICONDUCTOR ELECTRONIC DEVICES AND METHODS OF MANUFACTURE THEREOF

FIELD OF THE INVENTION

The present invention relates to electronic devices and their methods of manufacture, and in particular, although not exclusively, to thin film transistors.

BACKGROUND TO THE INVENTION

A wide variety of electronic devices and methods for their manufacture are known. Field effect transistors are well known, including thin film transistors. These thin film transistors typically comprise source and drain terminals formed from conductive material, connected by a layer or body of semiconductor material. A gate terminal of conductive material is arranged over or under the semiconductor channel that connects the source and drain, separated from the semiconductor material by a suitable layer or body of dielectric material, such that a voltage applied to the gate controls the conductivity of the semiconductive channel between the source and drain. Clearly, as the source and drain are formed from conductive material, and the semiconductive channel is formed from semiconductor material, these components of the device need to be formed in separate steps, and, depending on the particular manufacturing techniques used, a problem to be overcome may be the correct alignment of the deposited or otherwise-formed semiconductor material with respect to the already-formed source and drain terminals, or vice versa.

SUMMARY OF THE INVENTION

It is an aim of embodiments of the present invention to obviate, mitigate, or solve at least partly one or more of the problems associated with the prior art. It is an aim of certain embodiments of the invention to provide one or more of the advantages described below.

Certain embodiments aim to provide methods of manufacturing electronic devices having fewer and/or simpler steps than are required with prior art techniques. Certain embodiments aim to provide methods of manufacturing electronic devices which avoid, or overcome at least partly one or more alignment problems associated with prior art techniques. Certain embodiments aim to provide methods of manufacturing electronic devices which are compatible with high-volume, large-scale applications and/or the manufacture of electronic devices on flexible substrates.

According to the present invention there is provided a method of manufacturing an electronic device (e.g. a transistor), the method comprising:
 providing a layer of semiconductor (which may also be described/referred to as semiconductive) material comprising a first portion, a second portion, and a third portion, the third portion connecting the first portion to the second portion and providing a semiconductive channel for electrical current flow between the first and second portions;
 providing a gate terminal (e.g. spaced from said layer) arranged with respect to said third portion such that a voltage (potential) may be applied to the gate terminal to control an electrical conductivity of said channel;
 processing (adapting) at least one of the first and second portions (which may also be described/referred to as selectively processing or adapting at least one of the first and second portions) so as to have an electrical conductivity greater than an electrical conductivity of the channel when no voltage is applied to the gate terminal.

In certain embodiments, said processing comprises exposing at least one of the first and second portions to electromagnetic radiation, e.g. laser radiation to increase electrical conductivity beyond an initial level. This exposure, in certain embodiments, can convert the semiconductor material to conductive material.

In certain embodiments the processing comprises exposing both of the first and second portions to said electromagnetic radiation at the same time.

In certain embodiments the electromagnetic radiation is laser radiation, for example from an excimer or an exciplex laser. In other embodiments, other lasers and indeed other radiation sources may be used.

In certain embodiments the exposing comprises exposing said portion or portions to at least one pulse of said electromagnetic radiation, e.g. one pulse or a series of pulses.

In certain embodiments the electromagnetic radiation substantially comprises electromagnetic radiation having a wavelength in the range 100 nm to 1000 nm, for example 248 nm, 266 nm, 355 nm, or 532 nm.

In certain embodiments the method further comprises providing a layer of electrically insulative material covering at least the first and second portions, and the processing comprises exposing at least one of the first and second portions to said electromagnetic radiation through said layer of electrically insulative material. The covering of insulative material in certain embodiments helps to prevent ablation of the semiconductor material whilst it is being exposed (e.g. laser annealed) to increase its conductivity (for example to convert it to conductive material).

In certain embodiments the layer of electrically insulative material also covers the third portion and provides a gate dielectric.

Thus, it will be appreciated that in certain embodiments the processing comprises laser annealing.

As will be appreciated, in certain embodiments the electronic device may be a transistor, with the first portion defining a source terminal and the second portion defining a drain terminal.

Advantageously, the processing of at least one of the first and second portions, and in certain embodiments the processing of both, enables source and/or drain terminals having high electrical conductivities to be provided, without having to employ conductive material such as a metal, which in prior art techniques has to be formed in a step separate from the formation of the semiconductor layer. This formation of more-conductive terminal regions or portions, leaving the semiconductive channel portion substantially unaffected, from portions of a single layer of semiconductive material therefore represents a simplification of the manufacturing process compared with certain prior art techniques. Furthermore, certain alignment problems are avoided, as there is no requirement to form any body of semiconductive material in a particular position with respect to pre-formed source and drain terminals. Instead, the first, second, and third portions, which together define the source and drain terminals of certain embodiments and the controllable semiconductive channel connecting them, are all integral parts of a single layer of semiconductor material.

The processing of at least one of the first and second portions to increase its electrical conductivity compared with the basic conductivity of the channel portion can be regarded as selective processing or adapting of at least one of the first and second portions. In certain embodiments, this processing therefore comprises selectively adapting the first and second portions so as to have higher conductivity than the material of the third portion.

In certain embodiments, the selective processing or adapting is arranged so as to produce a substantially permanent change in the electrical conductivity of the relevant portion or portions. Such permanent changes may be effected, for example, by laser or thermal annealing, chemical doping, ion implantation etc.

In certain embodiments, the semiconductive channel comprises the whole of the third portion, but it will be appreciated that in alternative embodiments the semiconductive channel may form just part of the third portion. However, in certain embodiments it is advantageous for the semiconductive channel to extend fully across a width of the third portion, such that any current flow from the first to the second portion through the third portion must be via the semiconductive channel. By arranging the gate terminal so as to be able to control the conductivity of a semiconductive channel extending across a full width of the third portion, this enables full control, using the gate, of electrical current flow between the first and second portions, in particular in the sense that an appropriate voltage may be applied to completely close the channel.

It will be appreciated that in certain embodiments the first portion is a source portion or region, the second portion is a drain portion or region, and the third portion is a channel portion or region connecting the source region to the drain region. The processing may then comprise the selective processing or adaptation of the semiconductor material forming the layer so as to selectively increase the inherent conductivity of the source and/or drain regions compared with the channel (which in certain embodiments is left substantially unaltered). This selective processing to increase conductivity can take a variety of forms, as will be appreciated from the following description. In certain embodiments, for example, this processing comprises exposing the first and/or second portions to a flux of ions to introduce dopants, or increase the doping levels of the first and/or second regions compared with the third region (i.e. semiconductive channel). Thus, rather than forming metal source and drain contacts and then depositing a semiconductive channel connecting them, as in the prior art, in embodiments of the present invention the terminals and channel are all formed from different parts of a single layer of semiconductor material initially, the terminal portions of that layer then being selectively processed so as to increase their conductivities, leaving the semiconductive channel substantially unchanged.

In certain embodiments, this selective processing comprises annealing the first and/or second portions (e.g. at a temperature T) to increase the conductivity of the first and/or second regions compared with the third region (i.e. semiconductive channel). In certain embodiments the annealing is arranged to selectively elevate the temperature of the first and/or second portion relative to the third portion. In certain other embodiments, this selective processing comprises annealing the first and/or second portions with a laser (e.g. an excimer laser) so as to increase the conductivity of the first and/or second regions compared with the third region (i.e. semiconductive channel). In certain other embodiments, this selective processing comprises annealing the first and/or second portions with a lamp (e.g. an excimer lamp) so as to increase the conductivity of the first and/or second regions compared with the third region (i.e. semiconductive channel). In certain other embodiments, this selective processing comprises annealing the first and/or second portions in an atmosphere (such as oxygen, nitrogen, hydrogen, helium, argon, forming gas) so as to increase the conductivity of the first and/or second regions compared with the third region (i.e. semiconductive channel).

In certain other embodiments, this selective processing comprises annealing the first and/or second portions with an excimer laser so as to increase the conductivity of the first and/or second regions compared with the third region (i.e. semiconductive channel), and the gate terminal is partially transmissive of the excimer laser irradiation such that the conductivity of the third region is partially increased but substantially less so than the first and third regions.

Thus, it will be appreciated that in certain embodiments of the invention, each of the first, second, and third portions of the layer of semiconductor material initially has the same conductivity. At least one of the first and second portions or regions is then selectively processed so as to permanently (e.g. irreversibly) increase its conductivity above that initial conductivity.

Thus, in certain embodiments, after forming the semiconductor layer and gate terminal structure, one can selectively process the first and/or second regions to increase their conductivity substantially, for example rendering the first and second regions substantially or essentially conductive, rather than semiconductive. In this way, one can form substantially conductive source and drain terminals of a transistor from initially semiconductive portions of a layer of semiconductor material, leaving a semiconductive channel between the terminals substantially unchanged.

In certain embodiments, the electronic device is a transistor, for example a thin film transistor which may, for example, have a substantially transparent semiconductor layer (with regard to at least visible light). In certain embodiments, the gate terminal is substantially transparent, but in certain alternative embodiments the gate terminal is arranged so as to be fully or partially reflective (with regard to at least visible light and/or with regard to a bandwidth of radiation to which the structure is exposed during manufacture or use).

In certain embodiments, the layer of semiconductor material may be provided on a substrate or substrate structure. In other words, the method may further comprise supporting the layer of semiconductor material either directly or indirectly on a substrate. In certain embodiments, the substrate may be flexible, and the substrate may be formed from a material selected from a list comprising: glass (rigid or flexible); polymer (e.g. polyethylene naphthalate or polyethylene terephthalate); polymeric foil; paper; insulator coated metal (e.g. coated stainless-steel); cellulose; polymethyl methacrylate; polycarbonate, polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly (hydroxyether); polyurethane; polycarbonate; polysulfone; polyarylate; polyetheretherketone (PEEK); acrylonitrile butadiene styrene; 1-Methoxy-2-propyl acetate (SU-8); polyhydroxybenzyl silsesquioxane (HSQ); polyimide; Benzocyclobutene (BCB); $Al_2O_3$, $SiO_xN_y$; $SiO_2$; $Si_3N_4$; UV-curable resin; Nanoimprint resist; photoresist.

In certain embodiments, the providing of the layer of semiconductor material comprises forming said layer by a technique selected from a list comprising: printing; spin coating; vapour deposition (physical e.g. sputter; chemical e.g. PECVD); vacuum deposition (e.g. thermal or e-beam evaporation); (spin, dip, blade, bar, spray, slot-die); printing (jet, gravure, offset, screen, flexo); pulsed-laser deposition (PLD); atomic-layer deposition (ALD) coating.

Thus, certain embodiments may employ techniques for providing and/or forming the layer of semiconductor material which are compatible with the formation of large-scale structures or circuits, such as large-area displays on flexible substrates.

In certain embodiments, the method further comprises using the gate terminal as a mask to mask the semiconductive channel from the processing being used to increase the electrical conductivity of the first and/or second portions.

In certain embodiments, the processing comprises selectively increasing the doping of at least one of the first and second regions, compared with the semiconductive channel.

In certain embodiments, the processing comprises implanting ions to dope, or increase the doping of the semiconductor material of at least one of the first and second portions.

In certain embodiments, the processing comprises exposing a structure comprising the first, second, and third portions and the gate terminal to a flux of ions such that the gate terminal substantially masks at least a portion of the third portion (i.e. at least the semiconductive channel) from the ions, and such that ions are implanted in the first and second portions.

In certain embodiments, the semiconductive channel extends fully across a width of the third portion.

In certain embodiments, providing the gate terminal comprises forming a covering of resist material over the layer of semiconductor material (the covering may comprise a single layer of resist material, or a plurality of layers of resist material, i.e. a multilayer resist structure, optionally comprising a plurality of different resist materials), forming a window in said covering to expose said third portion, depositing a layer of dielectric material at least inside said window to cover said third portion, depositing a layer of conductive material at least inside said window to cover the layer of dielectric material inside the window, and removing remaining material of said covering of resist material so as to expose the first and second portions of the layer of semiconductor material, whereby the layer of conductive material covering the layer of dielectric material covering the third portion provides said gate terminal.

In certain embodiments, forming said window comprises forming a depression (e.g. by imprinting, for example with a single or multi-level imprint tool) in the covering of resist material, and then removing resist material at least from the base of the depression (i.e. developing the depression) so as to expose said third portion.

In certain embodiments, said window is arranged to have a width greater than a width of the third portion such that said window extends beyond edges of the third portion. Thus, the window may expose portions of a substrate supporting the third portion, on either side of the third portion, in addition to the third portion itself.

By having the gate terminal extend beyond edges of the semiconductive channel/third portion, this provides the advantage that, when using techniques such as ion implantation to increase conductivity of the first and second portions, the full width of the semiconductive channel provided by the third portion is masked, thereby ensuring that no regions of increased conductivity are formed in the third portion extending from the first to the second region. In other words, this ensures that the semiconductive channel is preserved across the whole width of the third portion, thereby enabling full control of the device to be achieved, in the sense that a potential can be applied to the gate terminal so as to completely switch off, simply between the first and second portions.

In certain embodiments, the method further comprises forming an undercut in the window, before depositing the layer of dielectric material. Advantageously, this results in the window being slightly narrowed when the dielectric layer is deposited, which in turn means that the layer of conductive material forming the gate terminal on top of the layer of dielectric material is slightly smaller than the layer of dielectric material covering the third portion. This helps ensure that the conductive material of the gate does not make direct contact with the first or second portions.

In certain embodiments the layer of semiconductor material is a thin film, for example a thin film of semiconductor material selected from a list comprising: metal oxides such as zinc oxide, tin oxide, cuprous oxide; inorganic semiconductor such as amorphous, microcrystalline or nanocrystalline silicon; binary metal oxides such as zinc tin oxide, indium tin oxide, indium zinc oxide; ternary metal oxides such as GaInZnO; metal oxynitrides e.g. $Zn_xO_yN_z$; organic semiconductors.

Another aspect of the present invention provides an electronic device comprising a layer of semiconductor material comprising a first portion, a second portion, and a third portion, the third portion connecting the first portion to the second portion and providing a semiconductive channel for electrical current flow between the first and second portions;
 a gate terminal arranged with respect to said third portion such that a voltage may be applied to the gate terminal to control an electrical conductivity of said channel,
 wherein at least one of the first and second portions is adapted so as to have an electrical conductivity greater than an electrical conductivity of the channel when no voltage is applied to the gate terminal (e.g. at least one of the first and second portions may be more highly doped than the third portion).

In certain embodiments, the electronic device is a transistor, for example a thin film transistor in which the layer of semiconductor material and the gate terminal are substantially transparent at least to visible light.

In certain embodiments, the electronic device is a transistor, for example a thin film transistor in which the layer of semiconductor material is substantially transparent at least to visible light but the gate terminal is at least partially reflective of visible light. In certain embodiments the gate (e.g. Au) may need to reflect UV light such that the effect on the masked semiconductive material is substantially less than that on the unmasked semiconductive material. In certain embodiments, laser annealing may be able to improve the semiconductive/dielectric interface by removing traps, provided the effect does not increase the conductivity too much.

In certain embodiments, the gate terminal is spaced from the third portion, in a direction substantially normal to the plane of the layer of semiconductive material. For example, in certain embodiments the gate terminal is arranged above the third portion, and in alternative embodiments the gate terminal is arranged below the third portion.

In certain embodiments, the gate terminal is arranged to extend beyond edges of the third portion such that it can mask a semiconductive channel which extends fully across the width of the third portion.

In certain embodiments, the third portion is formed of semiconductive material having a first value of dopant concentration, and at least one of the first and second portions has a dopant level which is higher than that value.

A second aspect of the invention provides a method of manufacturing an electronic circuit comprising a first electronic device and a second electronic device, the method comprising the steps of:

provideng a layer of semiconductor material comprising a first region and a second region, the first and second regions being electrically separate, the first region to be incorporated in the first electronic device and the second region to be incorporated in the second electronic device;

forming a conductive track covering a portion of the first region and a portion of the second region;

processing portions of the first and second regions not covered by the track so as to have electrical conductivities greater than the portions covered by the track.

In certain embodiments the processing comprises exposing said portions of the first and second regions not covered by the track to electromagnetic radiation. Features of embodiments of the first aspect described above may be employed with corresponding advantage in this second aspect. For example, the processing may comprise laser annealing said portions of the first and second regions not covered by the track.

In certain embodiments the conductive track is spaced from the covered portion of the first region by a dielectric layer, such that the track provides a gate terminal of the first device.

In certain embodiments the conductive track is arranged to make electrical contact with the covered portion of the second region.

According to another aspect of the invention there is provided a semiconductor device comprising:

a layer of semiconductor material, a first portion (area) of said layer defining (providing) a first terminal (i.e. of said device), a second portion (area) of said layer defining (providing) a second terminal (i.e. of said device), and a third portion (area) of said layer defining (providing) a semiconductive channel (i.e. of said device) connecting the first terminal to the second terminal so as to provide a current flow path between said terminals via said channel, wherein at least one of the first and second portions is modified compared with the third portion so as to have an electrical conductivity greater than an electrical conductivity of the third portion.

According to yet another aspect of the invention there is provided a semiconductor device comprising:

a layer of semiconductor material, a first portion (area) of said layer defining (providing) a first terminal (i.e. of said device), a second portion (area) of said layer defining (providing) a second terminal (i.e. of said device), and a third portion (area) of said layer defining (providing) a semiconductive channel (i.e. of said device) connecting the first terminal to the second terminal so as to provide a current flow path between said terminals via said channel, wherein at least part of said first portion has a first electrical conductivity, at least part of said second portion has a second electrical conductivity, and at least part of said third portion has a third electrical conductivity, and at least one of said first and second conductivities is greater than said third conductivity.

In certain embodiments, at least one of the first and second portions has been exposed to electromagnetic radiation so as to increase its conductivity above an initial value.

BRIEF DESCRIPTION OF THE DRAWINGS

Embodiments of the invention will now be described with reference to the accompanying drawings, of which.

DETAILED DESCRIPTION OF EMBODIMENTS OF THE INVENTION

Figure 1A:
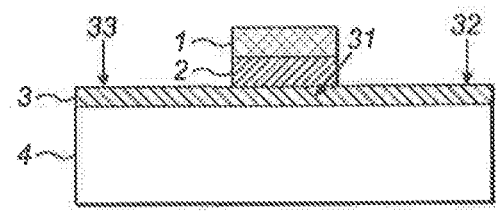
FIGS. 1A-C illustrates a thin-film electronic device embodying the invention, and having been formed by a method embodying the invention.

Referring now to FIG. 1A this shows a side-view representation of a multi-layer device on an insulative substrate 4 which has been fabricated by a method according to the invention. Layer 2 represents a patterned area of thin-film dielectric material. Layer 1 represents a patterned area of conductive material. Layer 3 represents a patterned area of thin-film semiconductor material. Layers 1 and 2 are arranged so that they are substantially aligned in the vertical direction, and are perpendicular to layer 3, such that layer 3 has exposed regions 32 and 33 and enclosed region 31. In other words, the longitudinal axes of layers 1 and 2 are aligned with and parallel with each other, and are substantially perpendicular to the longitudinal axis of layer 3. Thus, in this particular embodiment each of the layers 1, 2, and 3 is substantially rectangular, although in alternative embodiments these layers may have different shapes.

Figure 1B:
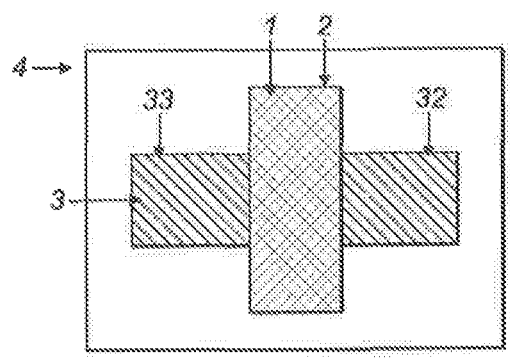

FIG. 1B shows a top-view of the device layers represented in FIG. 1A.

Figure 1C:
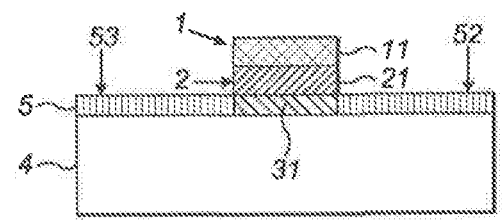

FIG. 1C shows a side-view of the device in FIGS. 1A and 1B after further processing to change the properties of the exposed regions 32 and 33 such that their conductivity is substantially increased. These regions 52 and 53 form part of layer 5 which is now conductive rather than semiconductive. Enclosed layer 31 is substantially unchanged after the processing. The device now has the features of a thin-film transistor with contact regions 52 and 53, channel area 31, dielectric area 21 and gate area 11. Contact region 52 thus provides a source terminal, and contact region 53 provides a drain terminal.

Figure 2A:
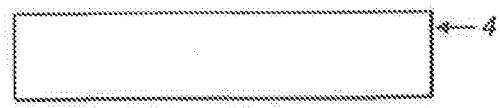
FIGS. 2A-2L illustrates a sequence of process steps in a method embodying the invention, and suitable for fabricating the device shown in FIG. 1A.
Figure 2B:
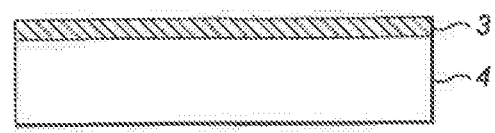
Figure 2C:
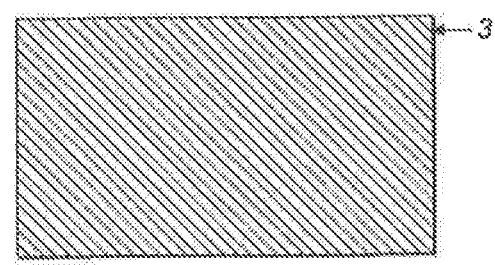
Figure 2D:
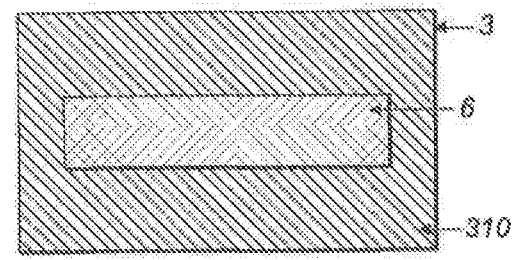
Figure 2E:
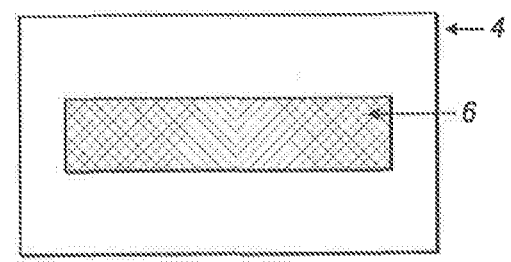
Figure 2F:
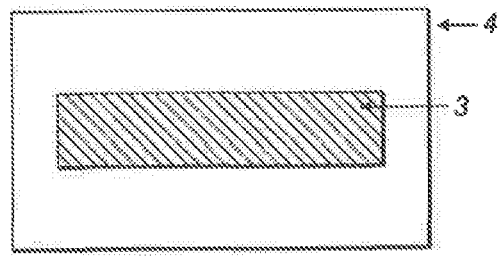
Figure 2G:
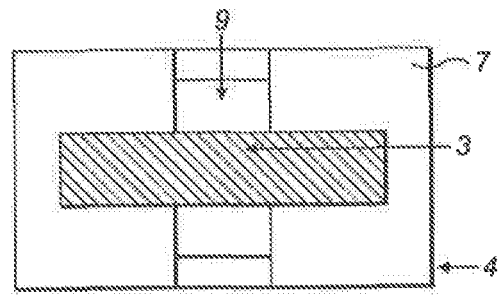
Figure 2H:
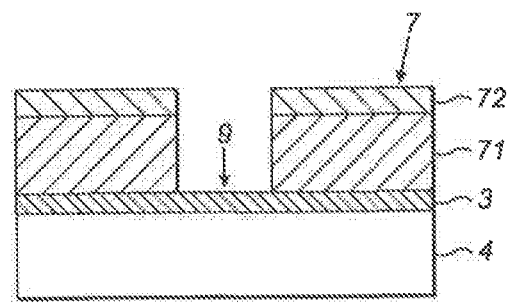
Figure 2I:
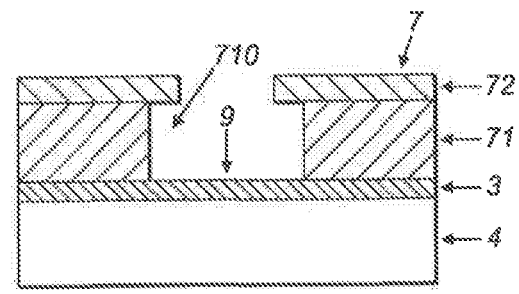
Figure 2J:
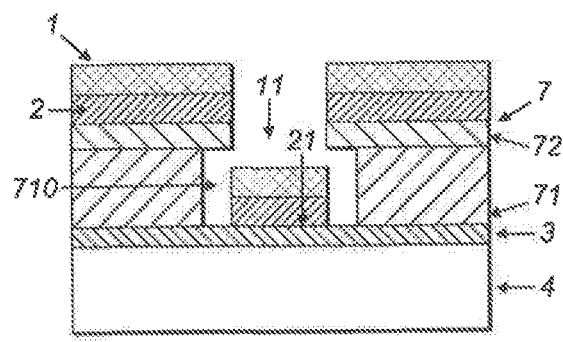
Figure 2K:
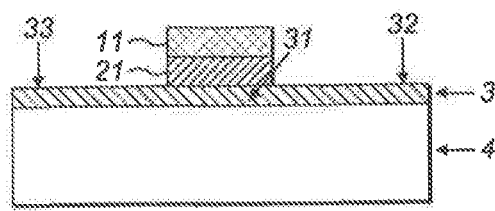
Figure 2L:
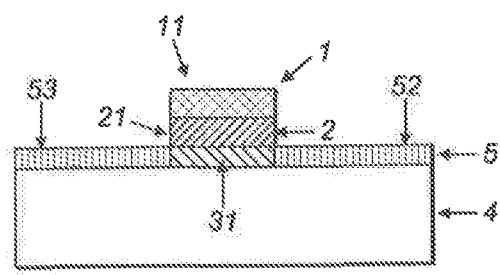

Referring now to FIG. 2, FIG. 2A shows an insulative substrate 4. FIGS. 2B-C show side-view and top-view representations of substrate 4 completely covered by a layer of thin-film semiconductor material 3. FIG. 2D shows a further stage where a layer of resist material 6 has been deposited to selectively cover a portion of layer 3, for example photoresist which has been patterned or a polymer that has been patterned by laser or mechanical cutting, by imprinting or embossing, followed by oxygen plasma ashing. Alternatively, in certain embodiments, the selective covering of a portion of the semiconductor layer with resist material is achieved by printing resist material over the desired area. Thus, in certain embodiments an area of the semiconductor layer is selectively covered by first covering the entire semiconductor layer, and then selectively removing resist material. In alternative embodiments, the desired area or portion of the semiconductor layer is covered by selectively depositing, printing, or otherwise covering that area with resist material. FIG. 2E shows a further stage where the exposed areas 310 of layer 3 have been removed, for example by etching (wet and/or dry etching techniques may be used), ablation, and/or milling. FIG. 2F shows a subsequent stage where resist material 6 has been removed, for example by using photoresist developer, ablation, oxygen plasma etc. FIG. 2G shows a top-view and FIG. 2H a side-view of a further stage where a layer or covering 7 of soluble resist material 71 and imprint resist material 72 have been deposited onto layers 3 and 4, and patterned to reveal window 9. FIG. 2I shows a further stage where a portion of soluble resist material 71 has been removed so as to create an undercut 710. FIG. 2J shows a subsequent stage where conductive layer 1 and dielectric layer 2 have been deposited onto the material stack in FIG. 2I to create patterned areas 11 and 21. Patterned area or layer 21 will form the dielectric layer or body separating the semiconductor channel of the eventual device from the gate terminal. Patterned area or layer 11 of conductive material forms the gate terminal, spaced above and separated from the semiconductor channel by the dielectric layer 21. FIG. 2K shows a further stage where soluble resist material 71 has been removed by solvent lift-off, removing also in the same process unpatterned areas of layers 1 and 2, and remaining layer 72. Layer 3 has been divided into exposed regions 32 and 33 and enclosed region 31. FIG. 2L shows a final stage where exposed regions 32 and 33 have been modified (for example by implantation, laser exposure and/or thermal annealing) to increase their conductivity, creating conductive layer 5 in those areas 52 and 53. Thus, areas or regions 52 and 53 provide source and drain terminals of the device.

Figure 3:
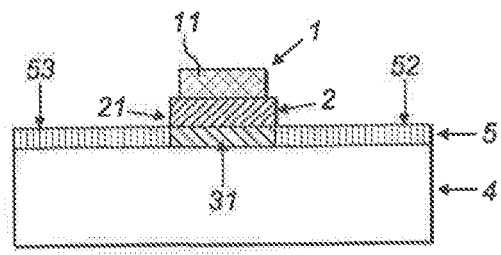
FIG. 3 illustrates another electronic device embodying the invention.

Referring now to FIG. 3 this shows a device formed by a method embodying the invention where the conductive layer 1 providing the gate terminal is narrower than the previously deposited dielectric later 2. The process of depositing layer 2 has had the effect of narrowing the window such that layer 1 in FIG. 3 has a width slightly narrower than layer 1 in FIG. 26.

Figure 4:
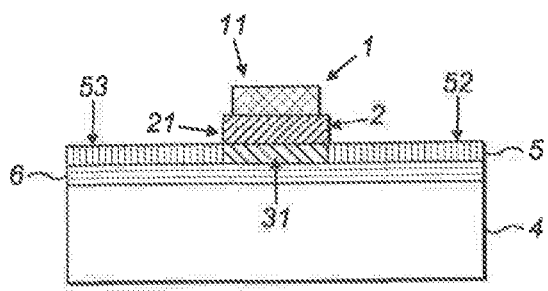
FIG. 4 illustrates another electronic device embodying the invention.

Referring now to FIG. 4 this shows a device formed by another method embodying the invention where an additional insulative layer 6 has been provided between substrate 4 and semiconductor layer 3. Insulative layer 6 gives the effects of improving the interface at the backside of the semiconductor layer and/or passivating the device, so as to minimise or eliminate back-channel effects.

Figure 5:
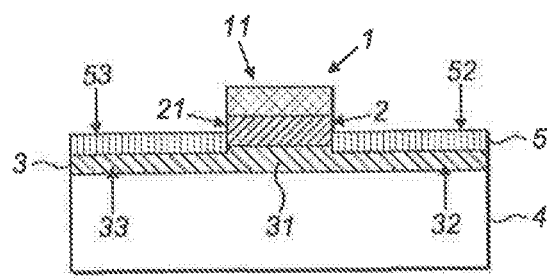
FIG. 5 illustrates another electronic device embodying the invention.

Referring now to FIG. 5 this illustrates a device formed by a method embodying the invention. There is provided an insulative substrate 4 completely covered by a layer of thin-film semiconductor material 3. The device has been fabricated using a process similar to that described in FIG. 2, but in this instance the semiconductive layer 3 is thicker and within the window 9 has been partially reduced by etching (after the same stage as FIG. 2H). The final process step of exposing unmasked regions 32 and 33 of semiconductive layer, results in the upper portions of exposed semiconductive layer 3 being converted into conductive regions 52 and 53. Thus, the selective processing of the unmasked portions of the semiconductor layer has formed regions 52 and 53 of increased conductivity, but these regions do not extend down through the full depth of the initial layer of semiconductor material. Instead, the regions 52 and 53 of increased conductivity have thicknesses which correspond to a portion of the total thickness of the original semiconductor layer. This results in a continuous layer of semiconductive material extending underneath and between the source and drain terminal areas 52 and 53.

Referring now to FIG. 6 this illustrates a circuit and processes to fabricate such a circuit in methods embodying the invention. FIG. 6A shows an imprint tool 400 with features of different heights 401, 402 and 403. FIG. 6B shows a top-view of the same imprint tool 400. FIG. 6C shows a top-view of an insulative substrate 4 supporting pre-patterned semiconductive region 3, comprising a plurality of discrete or distinct parts in this embodiment, which will form part of two discrete electronic devices T1 and T2. FIG. 6D shows a side-view of substrate 4 supporting regions of semiconductive material 3. FIG. 6e shows a stage in the process where a resist stack (or covering) 7 has been deposited onto substrate 4. Resist stack 7 consists of lift-off resist covering 71 and UV curable polymer 72. Resist stack 7 has been patterned by urging imprint tool 400, exposing to UV light and removing imprint tool 400 to create different height features relating to 401, 402 and 403. In the section of substrate 4 shown in FIG. 6E a window 93 has been created after removal of residual resist stack 7 from imprint features (matching height 402 on imprint tool 400) so as to expose the top surface of semiconductive region 3.

Figure 6A:
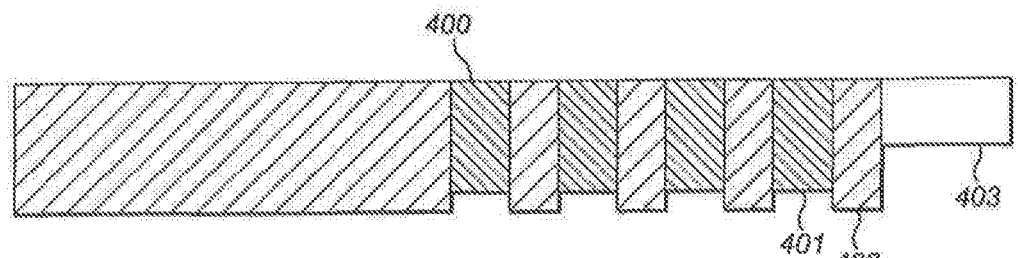
FIGS. 6A-6W illustrates a circuit embodying the invention and method steps, in a method also embodying the invention, to manufacture the circuit.
Figure 6B:
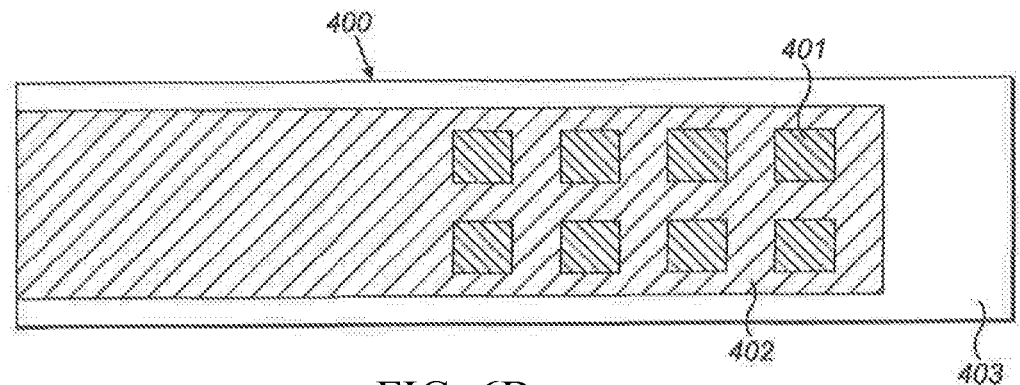
Figure 6C:
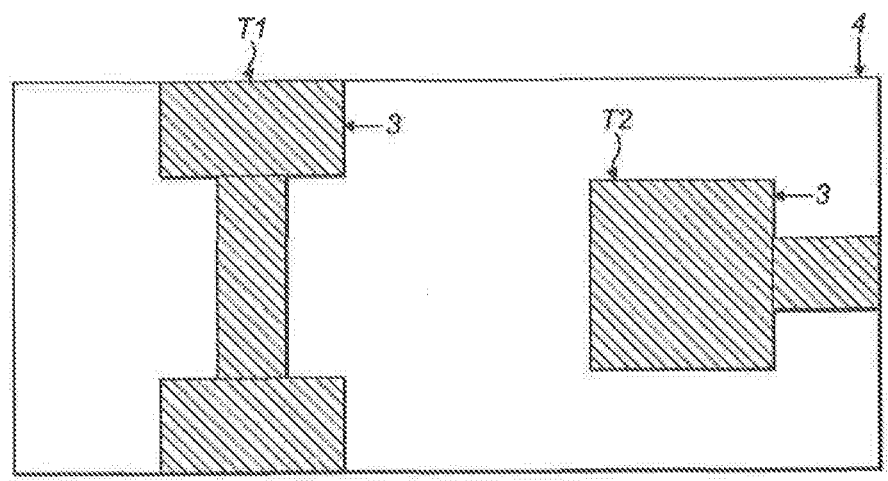
Figure 6D:
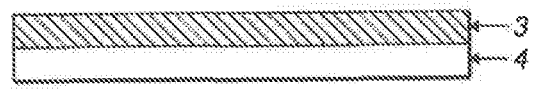
Figure 6E:
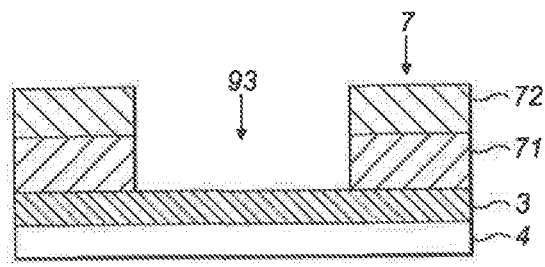
Figure 6F:
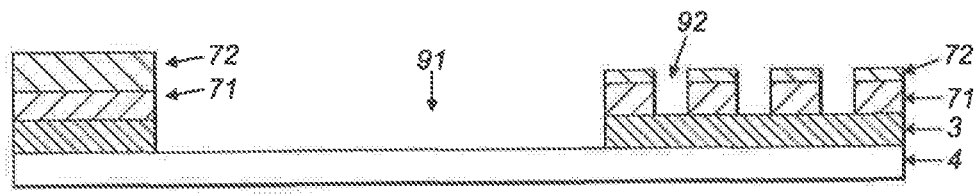

Referring now to FIG. 6F this shows a different section of the substrate 4 after imprinting with imprint tool 400 and removal of residual resist stack 7. The window 91 shown in this section of substrate 4 does not contain any semiconductive material 3. Resist stack 7 has been removed from window 91 during the process so as to expose the top surface of substrate 4. Window 92 has been additionally formed over T2 from imprint features height 401 and 402, followed by removal of residual resist stack 7 from within the trenches formed by the imprint tool 400. Window 93 has been formed over T1 from imprint features height 402. Thus, in the region of window 92, the grid geometry of the array of imprint features 402 which are arranged to produce depressions in the resist stack of the greatest depth has resulted in the resist stack in window 92 being divided (after appropriate development or deepening of the depressions) into a rectangular array (in this example) of discrete sub-stacks, with exposed portions of the upper surface of layer 3 separating these sub-stacks.

Figure 6G:
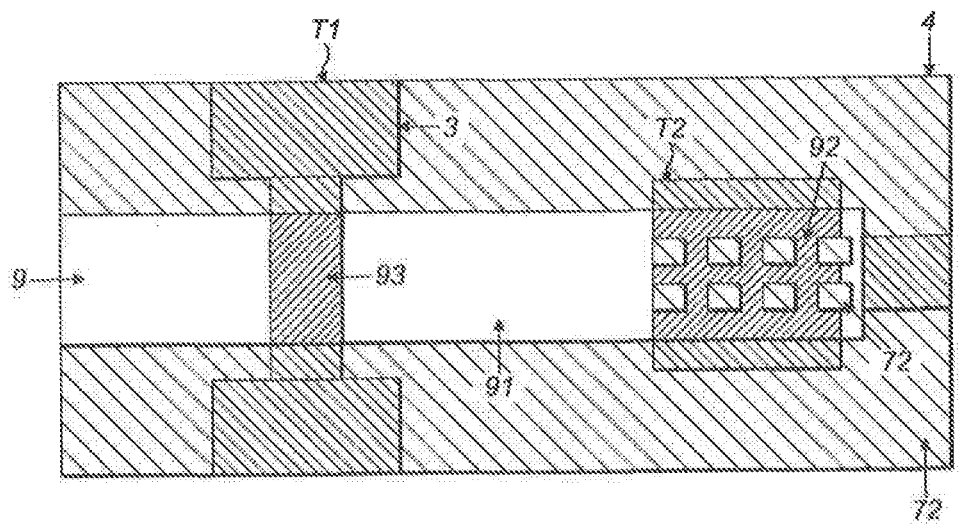

FIG. 6G shows a top-view of substrate 4 with a covering of resist stack 7 (only UV curable resist 72 is shown).

Window 9 covers the entire area over T1 and T2, in which the imprint tool has been applied. Window 91 covers the area between T1 and T2. Window 92 covers the area of T1.

Figure 6H:
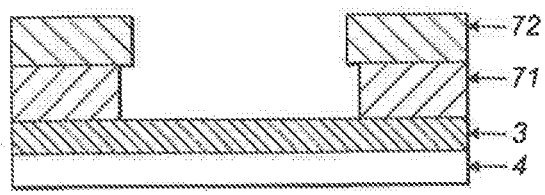
Figure 6I:
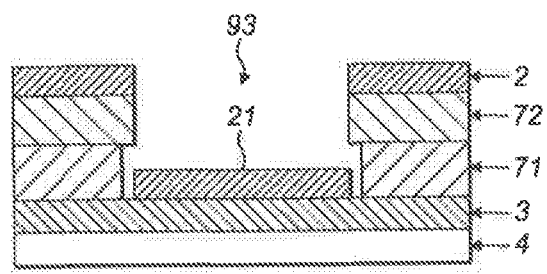
Figure 6J:
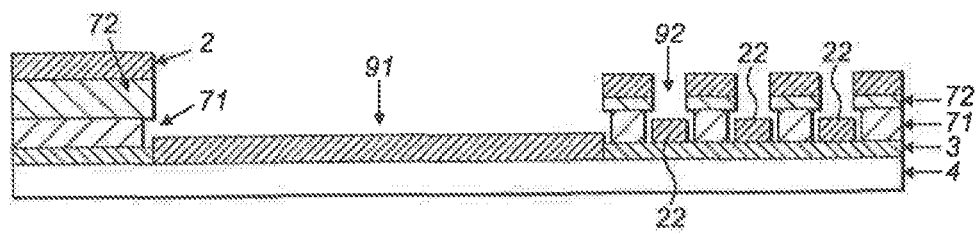
Figure 6K:
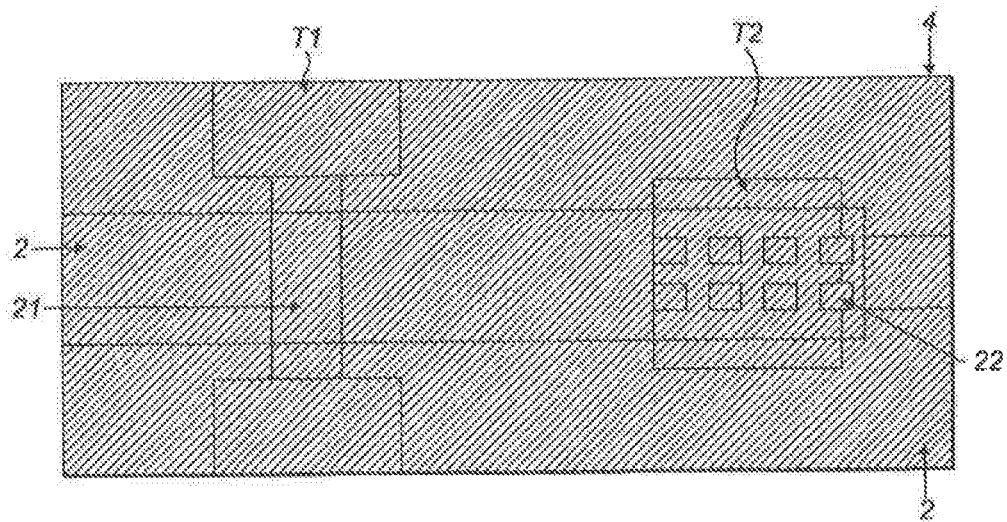

FIG. 6H shows a further stage in the process where lift-off resist material 71 has been laterally etched to create an undercut. FIG. 6I shows a further stage where dielectric material 2 has been deposited over the substrate, creating device dielectric region 21 within window 93. FIG. 6J shows the same process to deposit dielectric material 2 within windows 91 and 92, creating dielectric regions 22 in window 92. FIG. 6K shows the top-view of the structure covering T1 and T2 with dielectric material 2.

Figure 6L:
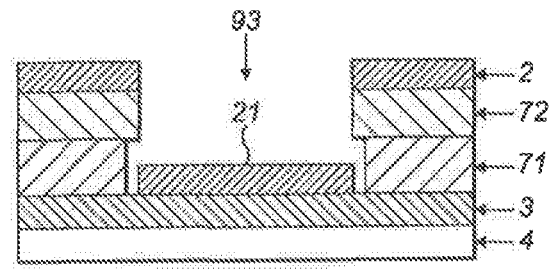
Figure 6M:
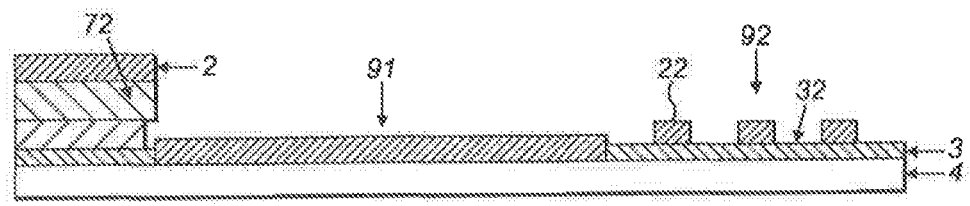
Figure 6N:
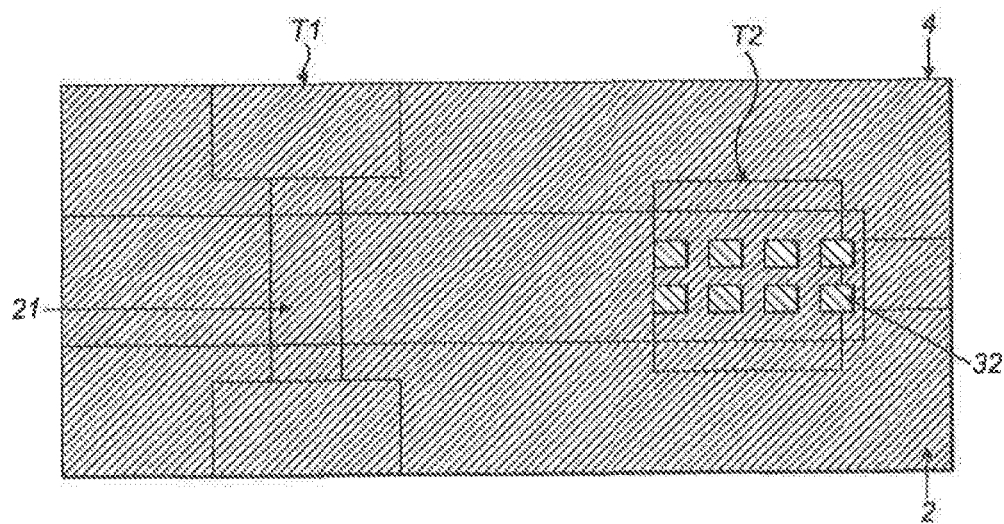

FIG. 6L shows a further stage in the process where lift-off resist material 71 has been further laterally etched (solvent process) i.e. after depositing dielectric material 21 inside the window (and on the upper surface of the surrounding resist stack 7). In FIG. 6M the effect of this process is shown, with the removal of lift-off resist 71 from window 92 in the same process removing regions of dielectric material 22, to leave patterned areas 32 of semiconductive material 2. FIG. 6N shows a top-view of the substrate after conductive regions 32 have been exposed. As will be appreciated from FIG. 6L, the method has incorporated the step of further undercutting the resist stack inside window 93 (in other words, extending or developing the already-formed undercuts in layer 71) so as to expose additional or further portions of the upper surface of layer 3 adjacent (i.e. on either side in this example) the dielectric layer 21 formed inside the window 93. It will also be appreciated that, in alternative embodiments in which dielectric layer 21 is formed inside window 93 without having first formed undercuts in the resist stack, the method may then comprise forming undercuts for the first time after depositing layer 21 so as to expose portions of the upper surface of layer 3 adjacent the dielectric layer or body 21.

Looking again at FIG. 6M, it will be appreciated that the additional undercutting step (i.e. undercutting the resist stack after depositing the dielectric layer 21) has had the effect of completely removing the array of sub-stacks from window 92. However, although the undercut in the portion of the resist stack shown at the left of the figure has been increased in size, exposing an additional portion of the upper surface of layer 3 in that region, the resist stack at that left hand side in the figure still essentially remains. The sub-stacks in the region of window 92 have been completely removed because of their smaller dimensions. As will be appreciated, the undercutting or additional undercutting step can be arranged so as to remove a thickness of resist material from layer 71 corresponding to, or just exceeding, half thickness of each of these sub-stacks. That ensures complete removal of the sub-stacks, exposing portions of the upper surface of layer 3, yet leaving resist stack features of substantially greater thickness in tact (in the sense that although the depth of undercuts may have been increased, the stack feature still remains).

Figure 6O:
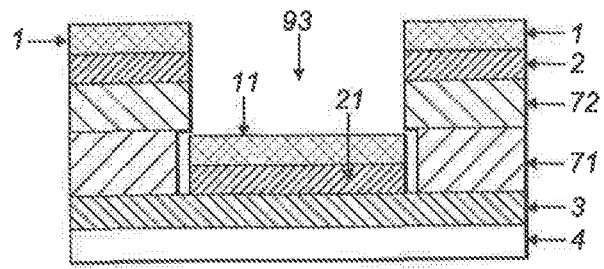
Figure 6P:
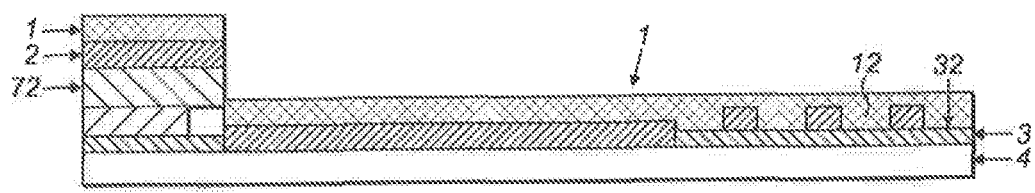
Figure 6Q:
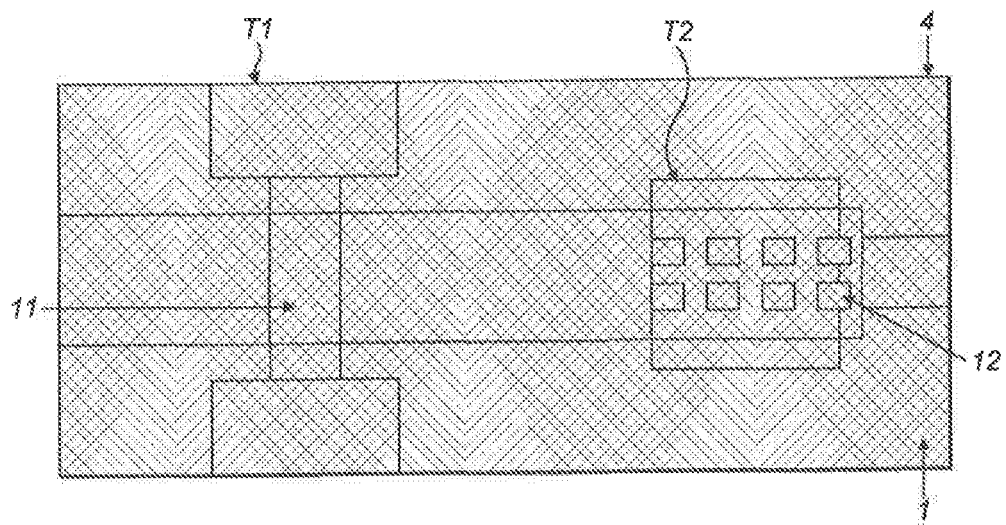

FIG. 6O shows a further stage in the process where a layer of conductive material 1 has been deposited onto the substrate, creating device conductive region 11 within window 93. In FIG. 6P the same process has provided a conductive region 12 which connects to semiconductive region 32. FIG. 6Q shows a top-view of the configuration after deposition of conductive layer 1.

Figure 6R:
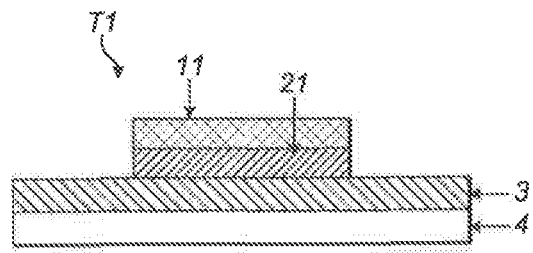
Figure 6S:
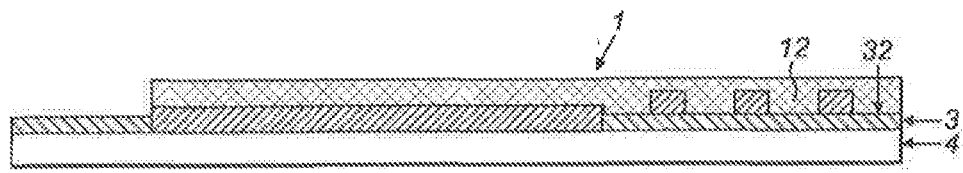
Figure 6T:
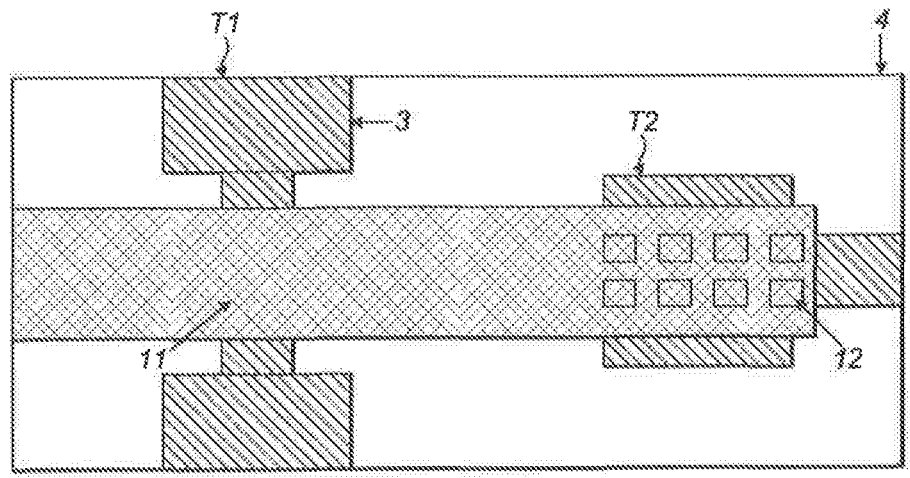

FIG. 6R shows a further stage in the process where resist stack 7 has been removed by solvent exposure of lift-off resist 71. In the same process regions of dielectric material 2 and conductive material 1 have been removed so as to leave device T1. In FIG. 6S the structure after removal of resist stack 7 is shown. Device T2 has been completed in window 92. The conductive layer 1 connects device T2 to T1 (the pathway was not previously shown as resist stack 7 was in front of this connection on the side-view). FIG. 6T shows the final top-view of the connection between devices T1 and T2.

Figure 6U:
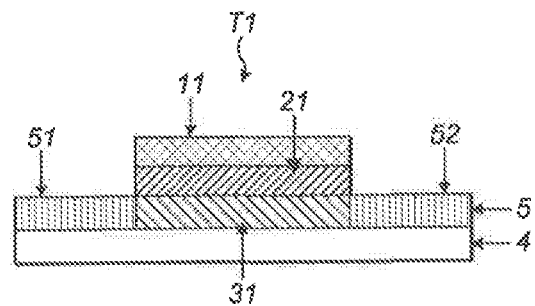
Figure 6V:
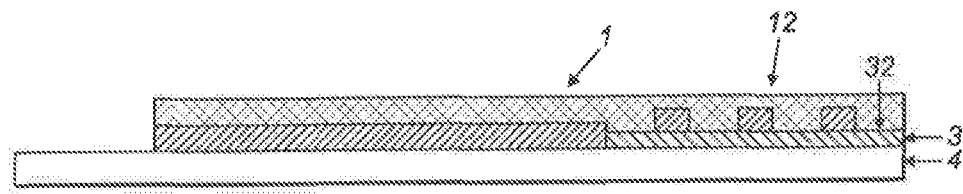
Figure 6W:
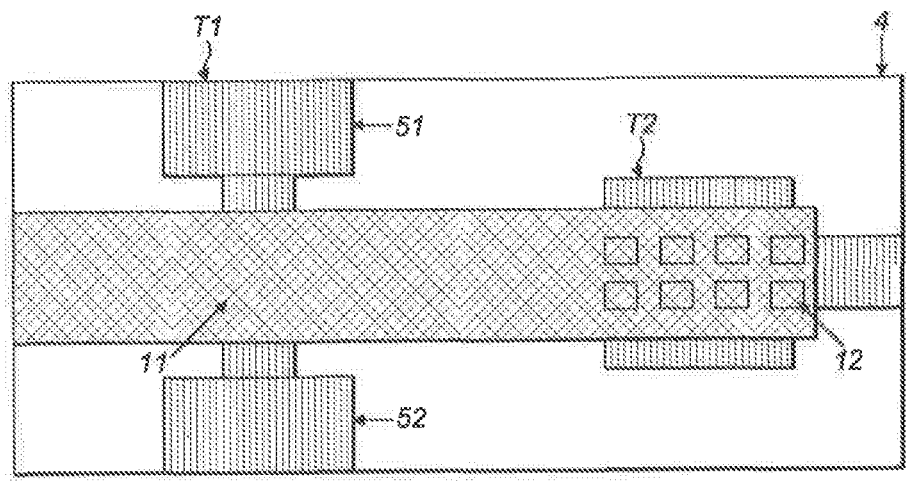

FIG. 6U shows a further stage after further processing to change the properties of the exposed semiconductive regions 31 and 32 such that their conductivity is substantially increased relative to enclosed layer 31, and they have been converted to conductive regions 51 and 52. The device T1 is now a thin-film transistor. FIG. 6V shows the same effect over device T2. FIG. 6W shows a top-view of the final structure connecting devices T1 and T2.

Referring now to FIG. 7 this illustrates a circuit and processes to fabricate such a circuit in methods embodying the invention. FIG. 7A shows an imprint tool 400 with features of different heights 401, 402 and 403. FIG. 7B shows a top-view of the same imprint tool 400. FIG. 7C shows a top-view of a substrate 4 supporting pre-patterned semiconductive region 3, which will form part of two discrete electronic devices T1 and T2. As will be appreciated, the two distinct parts of the semiconductor layer 3 shown in FIG. 7C can be formed using a variety of techniques. For example, they may have been formed from an initially common layer of semiconductor material, over which is then formed a layer of resist material. This may be imprintable resist, or some other form of resist, which is then patterned using appropriate techniques (for example by imprinting and/or exposure to electromagnetic radiation of the appropriate wavelength). The resist material may then be etched using appropriate techniques such that semiconductor material is also removed, leaving just the portions free shown in FIG. 7C. Alternatively, rather than starting with a continuous layer of semiconductor and selectively removing portions, the portions 3 may be formed by selective deposition, for example by printing.

Figure 7A:
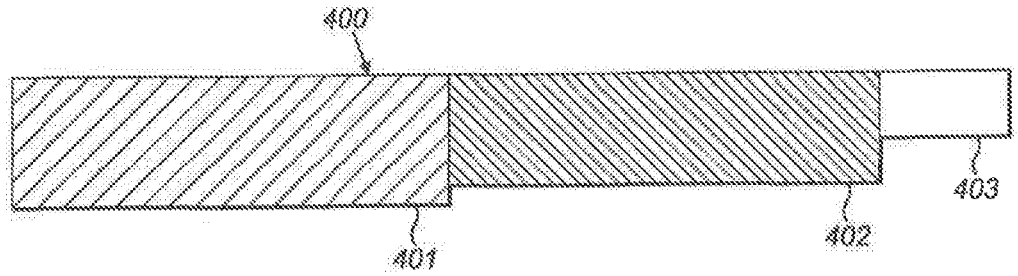
FIGS. 7A-7W illustrates another circuit embodying the invention and method steps, in a method also embodying the invention, to manufacture the circuit.
Figure 7B:
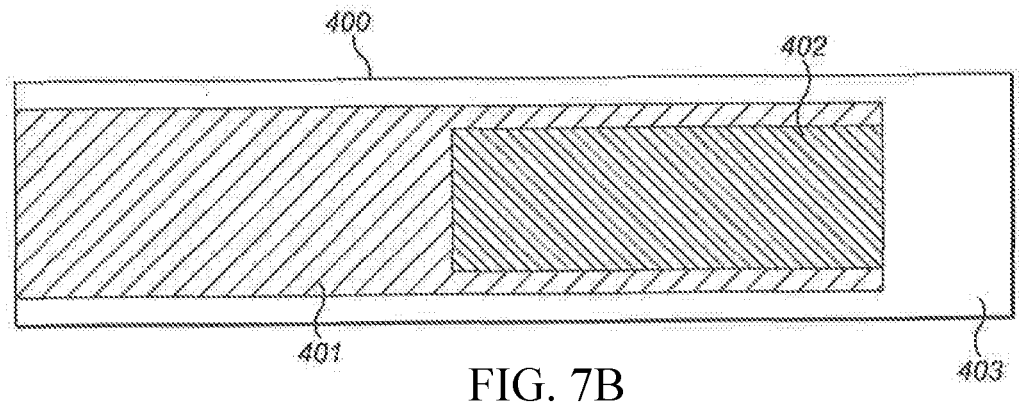
Figure 7C:
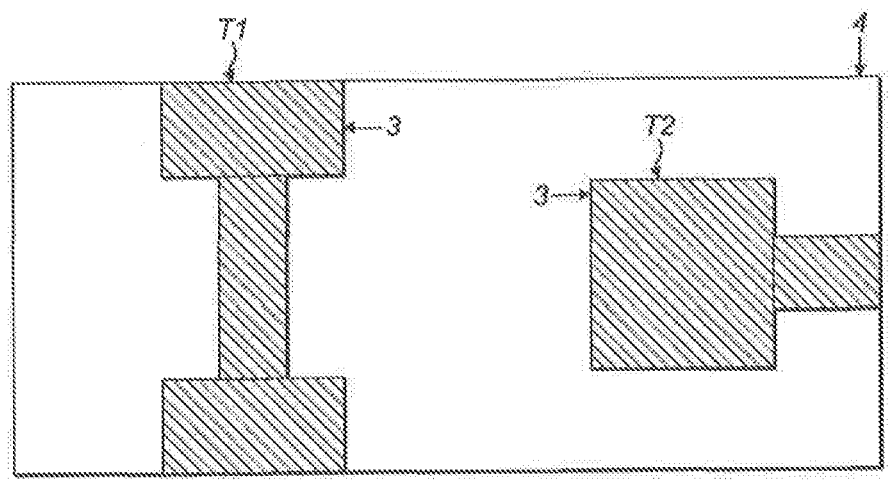
Figure 7D:
Figure 7E:
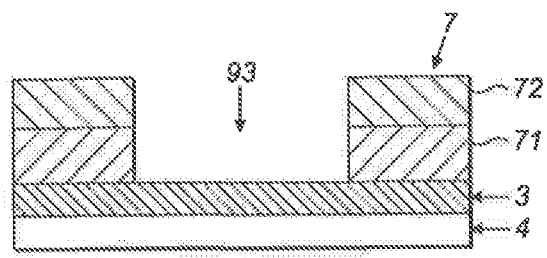

FIG. 7D shows a side-view of substrate 1 supporting region of semiconductive material 3. FIG. 7E shows a stage in the process where a resist stack 7 has been deposited onto substrate 4. Resist stack 7 consists of lift-off resist covering 71 and UV curable polymer 72. Resist stack 7 has been patterned by urging imprint tool 400, exposing to UV light and removing imprint tool 400 to create different height features relating to 401, 402 and 403. In the section of substrate 4 shown in FIG. 7E a window 93 has been created after removal of residual resist stack 7 from imprint features (matching height 402 on imprint tool 400) so as to expose the top surface of semiconductive region 3.

Figure 7F:
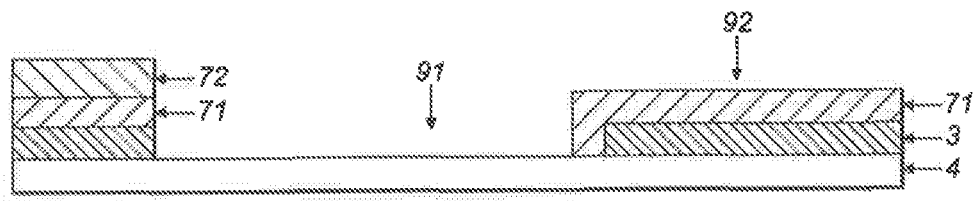

Referring now to FIG. 7F this shows a different section of the substrate 4 after imprinting with imprint tool 400 and removal of residual resist stack 7. The window 91 shown in this section of substrate 1 does not contain any semiconductive material 3. Resist stack 7 has been mostly removed from window 91 during the process so as to expose the top surface of substrate 4. Window 92 has been additionally formed over T2 from imprint features height 402, followed by removal of residual resist stack 7 from within the trenches formed by the imprint tool 400. Window 93 has been formed over T1 from imprint features height 402. As can be seen from FIG. 7F, the imprint features on the imprint tool 400 have been arranged such that, after appropriate development of the imprinted features (i.e. removal of resist stack material) a layer of resist material 71 (illustrated in the right hand side of the figure) covers an underlying portion of the layer of semiconductor material 3, but also extends beyond the edge of that layer so as to contact and cover an adjacent portion of the upper surface of the substrate 4.

Figure 7G:
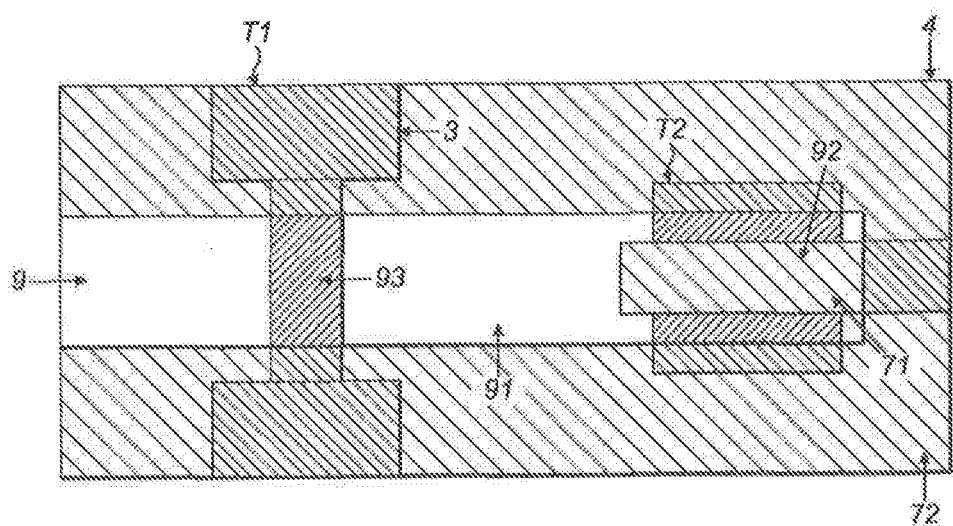

FIG. 7G shows a top-view of substrate 4 with a covering of resist stack 7. Window 9 covers the entire area over T1 and T2, in which the imprint tool has been applied. Window 91 covers the area between T1 and T2. Window 92 covers the area of T1 where the top-surface of lift-off resist layer 71 has been exposed.

Figure 7H:
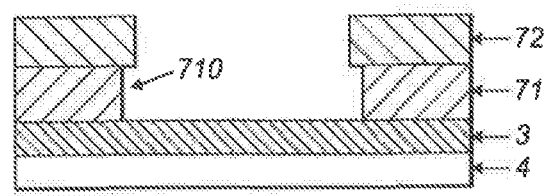
Figure 7I:
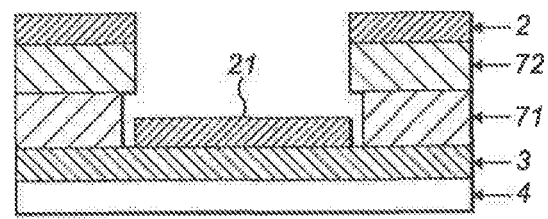
Figure 7J:
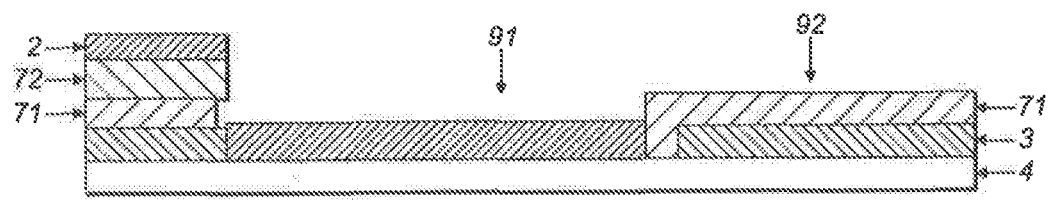
Figure 7K:
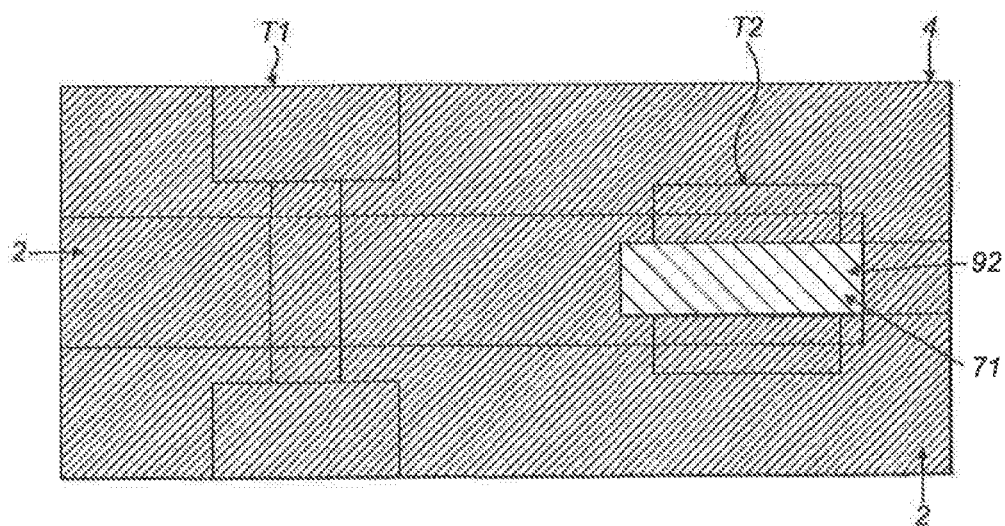

FIG. 7H shows a further stage in the process where lift-off resist material 71 has been laterally etched to create an undercut 710. FIG. 7I shows a further stage where dielectric material 2 has been deposited over the substrate, creating device dielectric region 21 within window 93. FIG. 7J shows the same process to deposit dielectric material 2 within window 91. In window 92, however, the properties of lift-off resist material 71 are such as to completely prevent deposition of layer 2 within this window. FIG. 7K shows the top-view of the structure covering T1 and T2 with dielectric material 2 covering the entire substrate except for window 92.

Figure 7L:
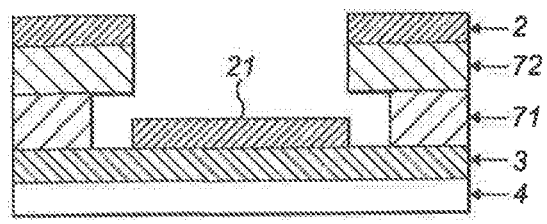
Figure 7M:
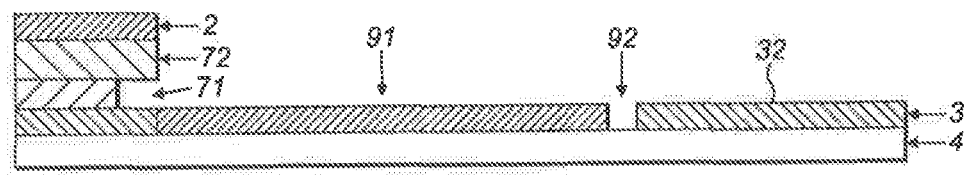
Figure 7N:
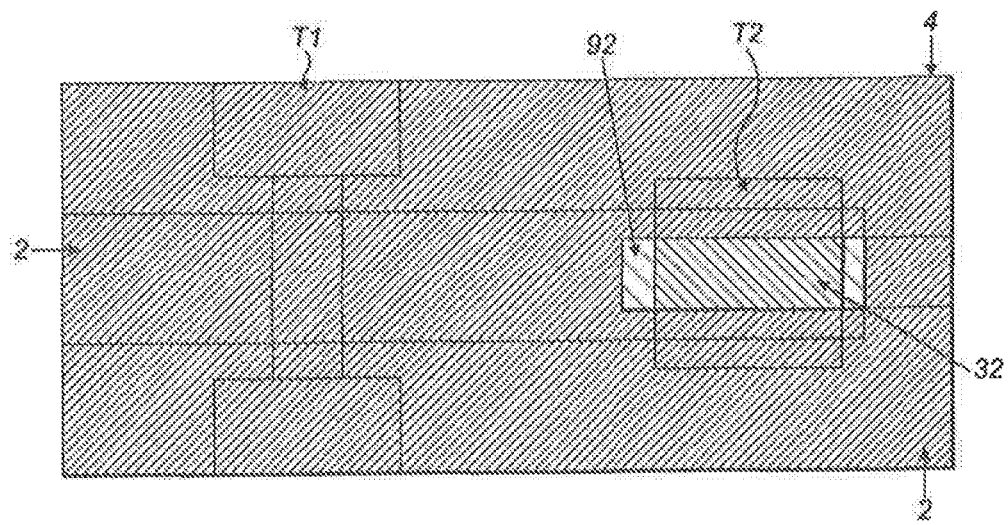

FIG. 7L shows a further stage in the process where lift-off resist material 71 has been further laterally etched (solvent process). In FIG. 7M the effect of this process is shown, with the removal of lift-off resist 71 from window 92 exposing semiconductive material 3, creating semiconductive region 32, and exposing a portion of the upper surface of substrate 4 between the layer of dielectric material in window 91 and the semiconductive region 32 in window 92. FIG. 7N shows a top-view of the substrate after semiconductive regions 32 have been exposed.

Figure 7O:
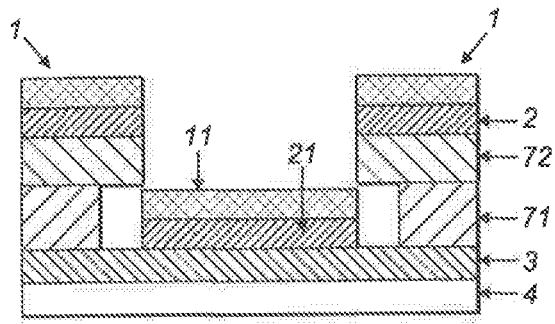
Figure 7P:
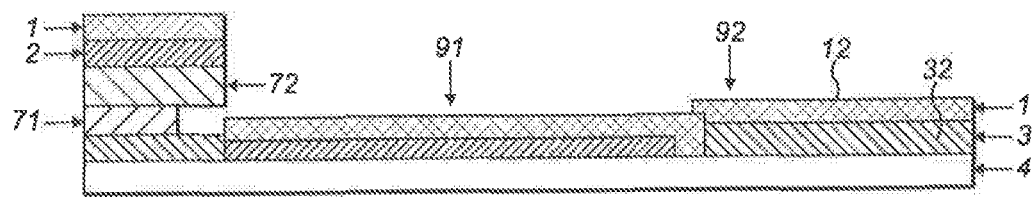
Figure 7Q:
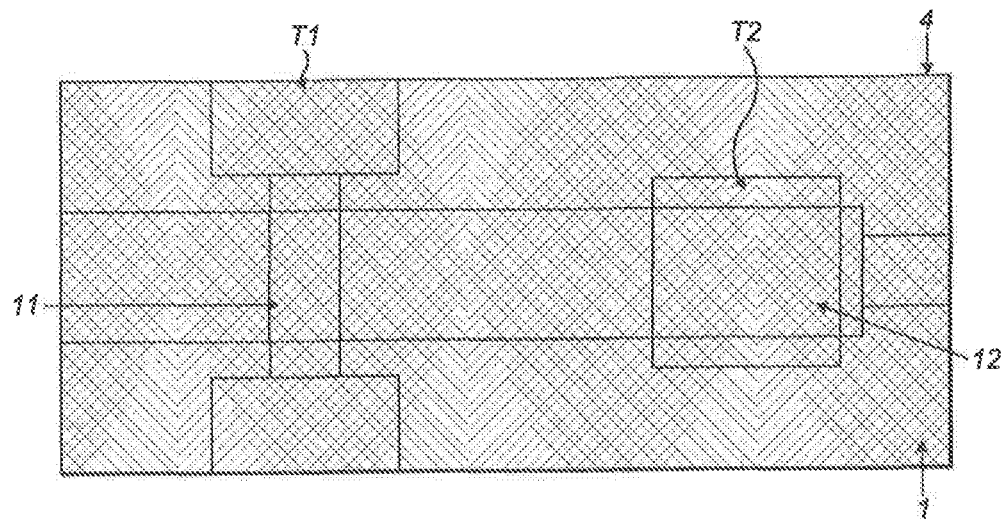

FIG. 7O shows a further stage in the process where a layer of conductive material 1 has been deposited onto the substrate, creating device conductive region 11 within window 93. In FIG. 7P the same process has provided a conductive region 12 which connects to semiconductive region 32. FIG. 7Q shows a top-view of the configuration after deposition of conductive layer 1.

Figure 7R:
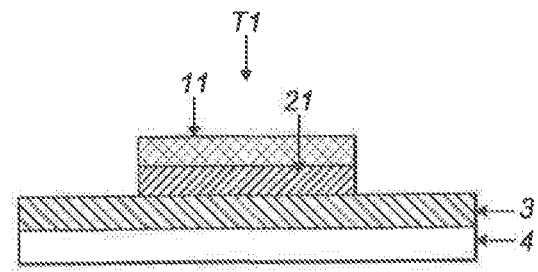
Figure 7S:
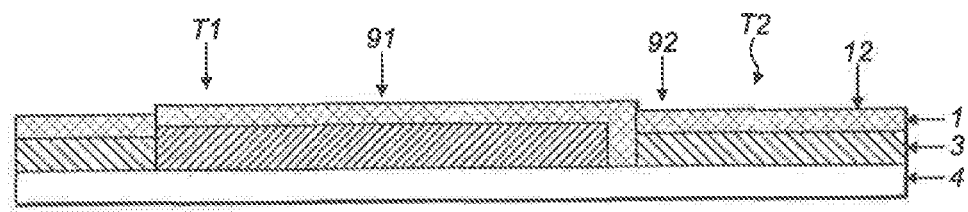
Figure 7T:
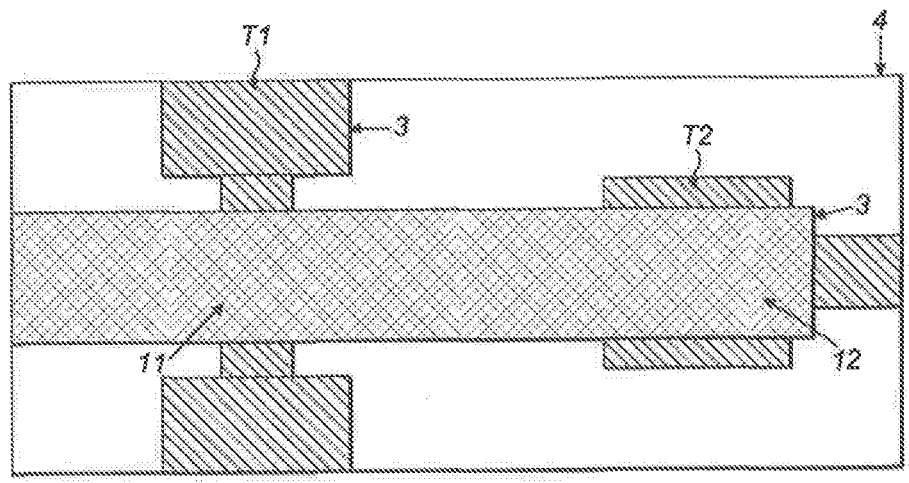

FIG. 7R shows a further stage in the process where resist stack 7 has been removed by solvent exposure of lift-off resist 71. In the same process regions of dielectric material 2 and conductive material 1 have been removed so as to leave device T1. In FIG. 7S the structure after removal of resist stack 7 is shown. Device T2 has been completed in window 92. The conductive layer 1 connects device T2 to T1 (the pathway was not previously shown as resist stack 7 was in front of this connection on the side-view). FIG. 7T shows the final top-view of the connection between devices T1 and T2.

Figure 7U:
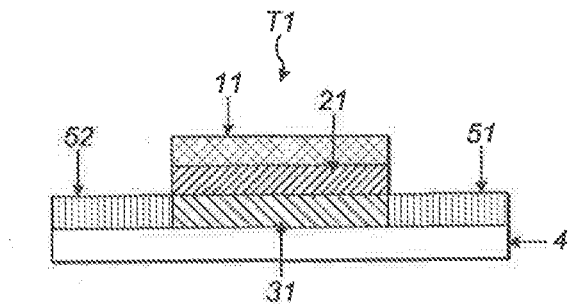
Figure 7V:
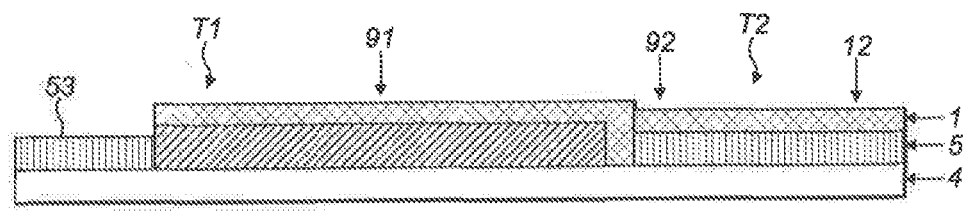
Figure 7W:
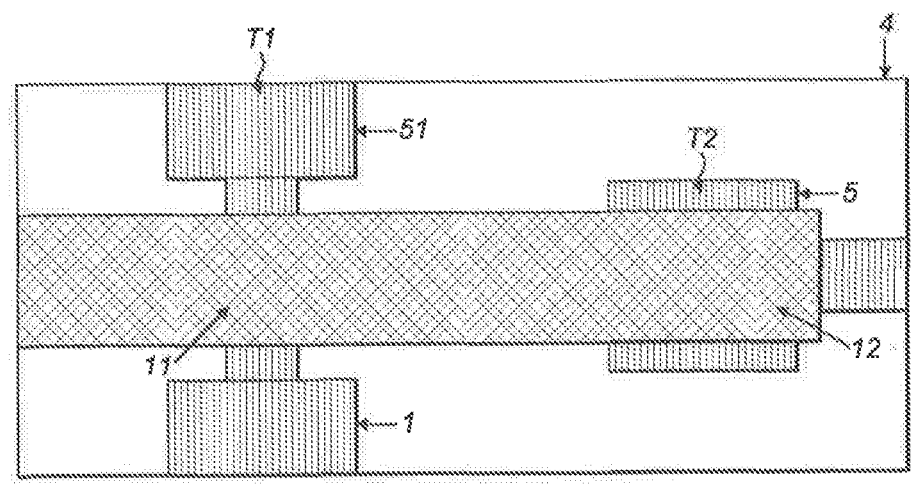

FIG. 7U shows a further stage after further processing to change the properties of the exposed semiconductive regions 31 and 32 such that their conductivity is substantially increased relative to enclosed layer 31, and they have been converted to conductive regions 51 and 52. The device T1 is now a thin-film transistor. FIG. 7V shows the same effect over device T2. FIG. 7W shows a top-view of the final structure connecting devices T1 and T2.

Referring now to FIG. 8 this illustrates a circuit and processes to fabricate such a circuit in methods embodying the invention. FIG. 8A shows an imprint tool 400 with features of different heights 401, 402 and 403. FIG. 8B shows a top-view of the same imprint tool 400. FIG. 8C shows a top-view of a substrate 4 supporting pre-patterned semiconductive region 3, which will form part of two discrete electronic devices T1 and T2.

Figure 8A:
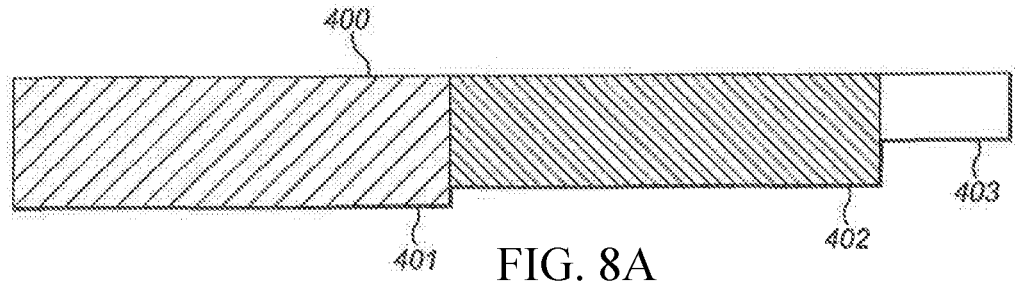
FIGS. 8A-8U illustrates another circuit embodying the invention and processes to fabricate a circuit in another embodiment of the invention.
Figure 8B:
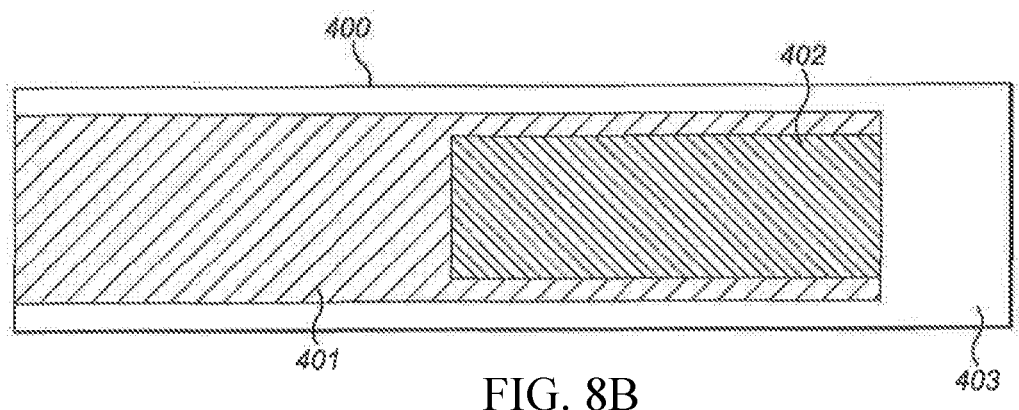
Figure 8C:
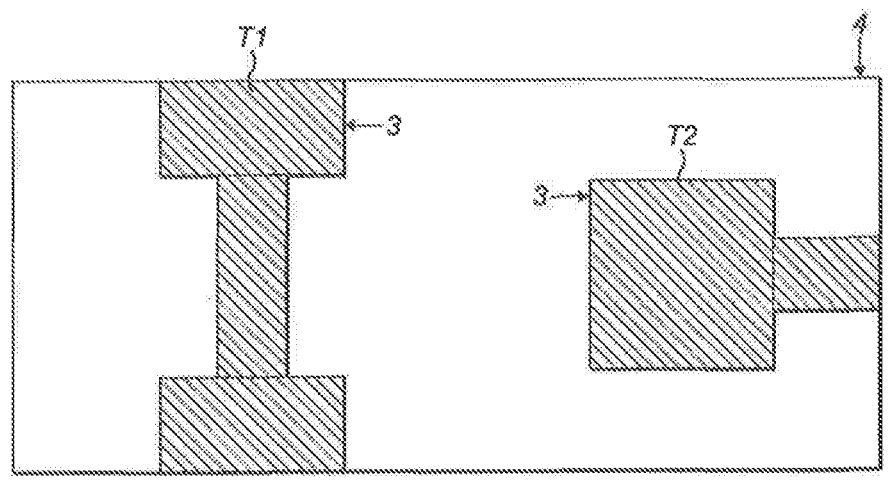
Figure 8D:
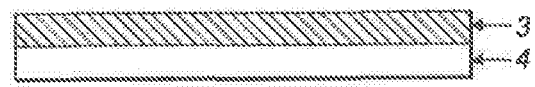
Figure 8E:
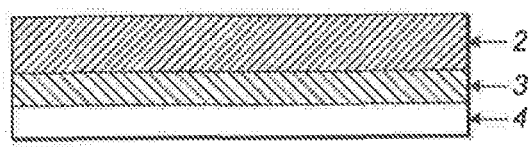
Figure 8F:
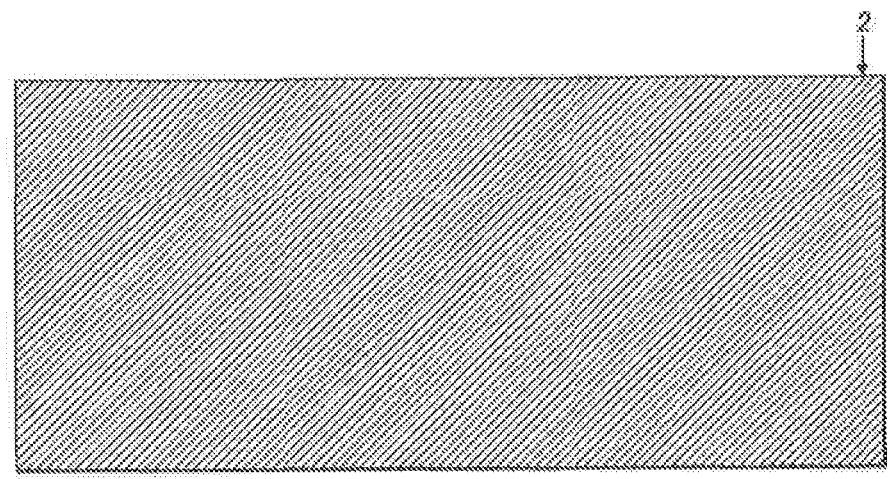

FIG. 8D shows a side-view of substrate 1 supporting region of semiconductive material 3. FIG. 8E shows a side-view following a further step in the process where a dielectric material 2 has been deposited over the substrate. FIG. 8F shows a top-view of the same stage shown in FIG. 8E.

Figure 8G:
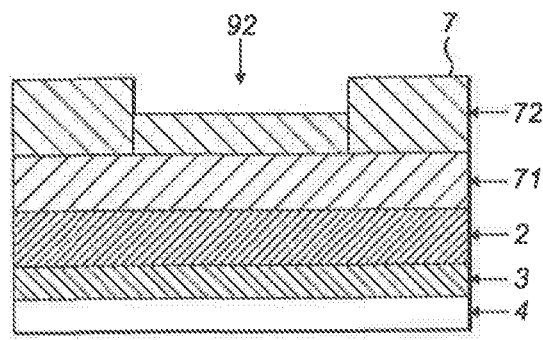

FIG. 8G shows a further stage in the process where a resist stack 7 has been deposited onto substrate 4. Resist stack 7 consists of lift-off resist covering 71 and UV curable polymer 72. Resist stack 7 has been patterned by urging imprint tool 400, exposing to UV light and removing imprint tool 400 to create different height features relating to 401, 402 and 403. A window 92 has been created relating to imprint features matching height 402 on imprint tool 400.

Figure 8H:
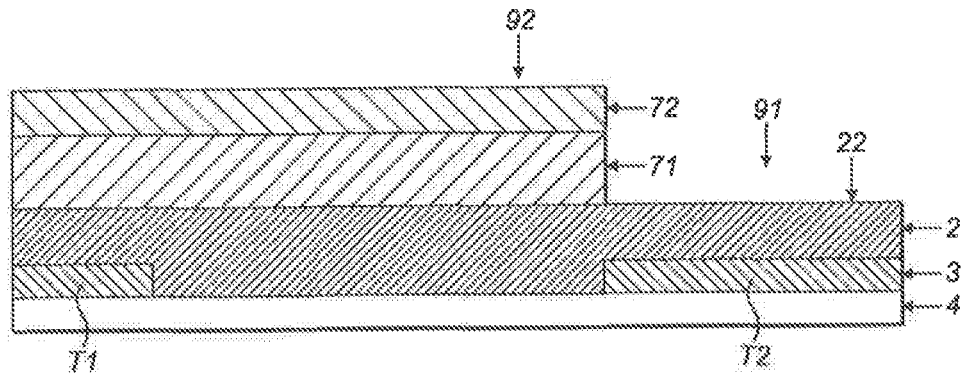

FIG. 8H shows the same stage in the process as FIG. 8G, with side-view of devices T1 and T2. A window 91 has been created after removal of residual resist stack 7 from imprint features matching height 401 on imprint tool 400. The top surface of dielectric layer 2 has been exposed in window 91 creating dielectric region 22.

Figure 8I:
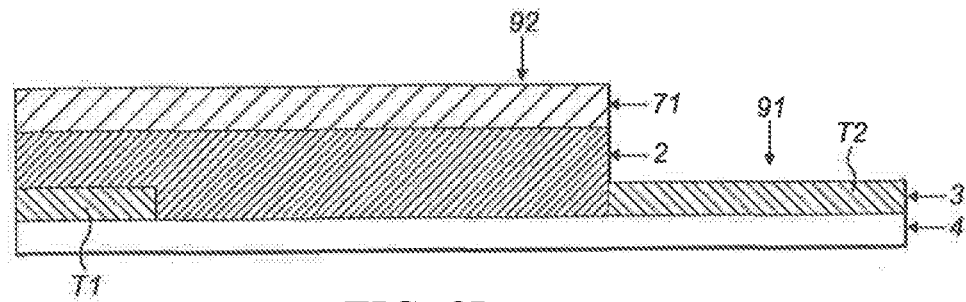
Figure 8J:
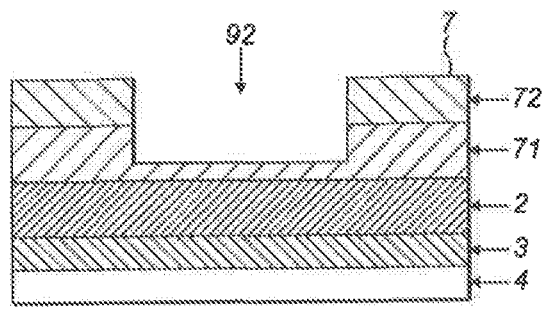

FIG. 8I shows a further stage where dielectric region 22 has been removed, e.g. by etching, in the same process further reducing the height of resist stack 7. The side-view in FIG. 8I shows only the resist stack within window 92. The top surface of lift-off resist 71 is now exposed within window 92. FIG. 8J shows a further side-view of the resist-stack 7 in window 92.

Figure 8K:
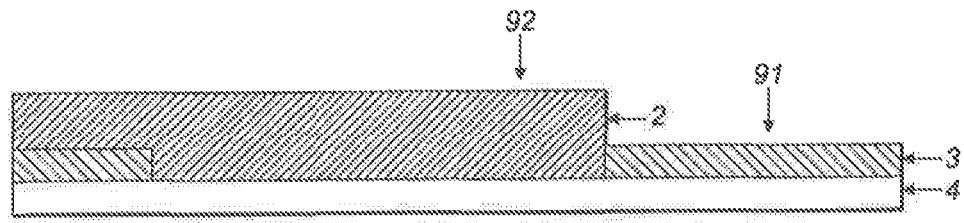
Figure 8L:
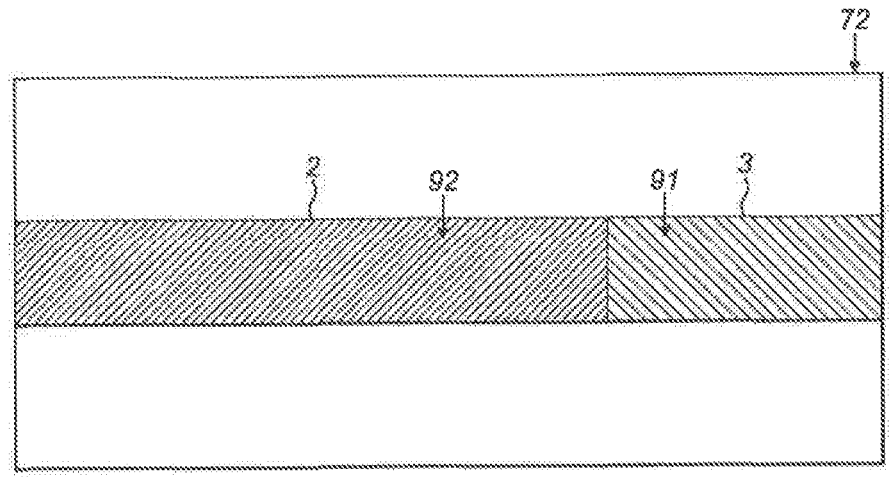
Figure 8M:
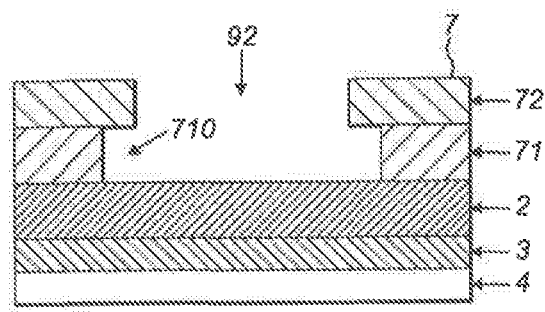

FIG. 8K shows a further stage of the process where lift-off resist material 71 has been laterally etched to create an undercut 710, as shown in a different side-view in FIG. 8M.

FIG. 8L shows a top-view of the configuration in which dielectric material 2 is exposed within window 92 and semiconductor material 3 is exposed within window 91.

Figure 8N:
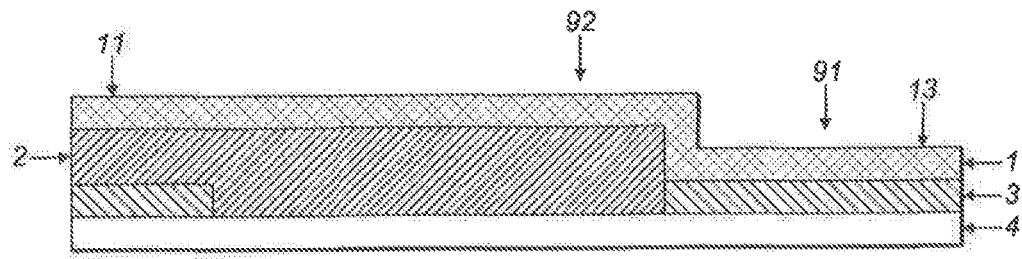
Figure 8O:
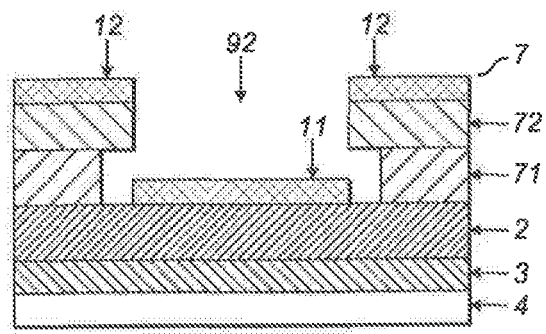

FIG. 8N shows a further stage in which conductive layer 1 has been deposited over the substrate, creating conductive regions 11 and 13. FIG. 8O shows the side-view of the configuration within window 92, where conductive region 11 has been formed over dielectric material 2 and conductive regions 12 have been formed on resist stack 7.

Figure 8P:
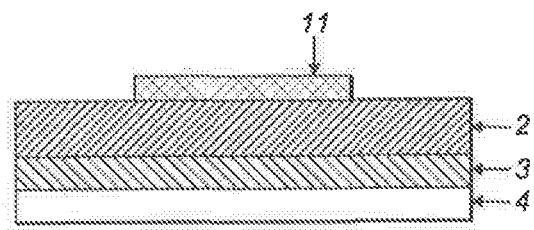
Figure 8Q:
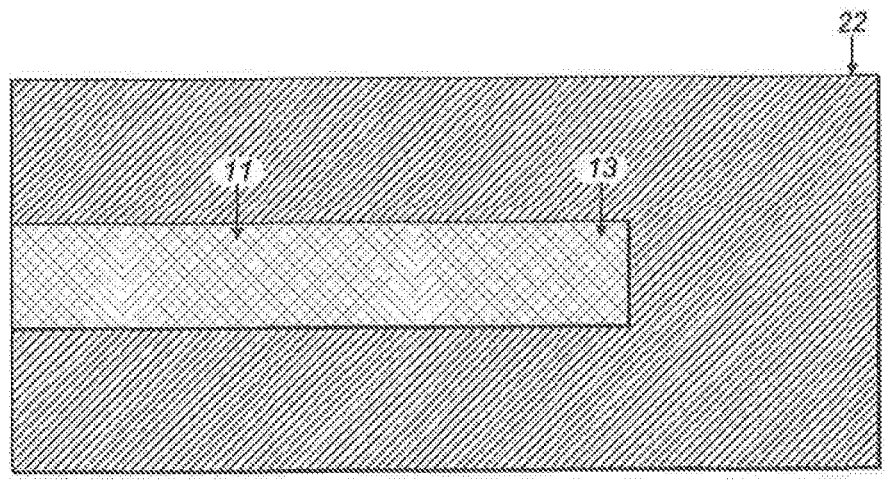

FIG. 8P shows a further stage in the process where resist stack 7 has been removed by solvent exposure of lift-off resist 71. In the same process regions 12 of conductive material 1 have been removed. FIG. 8Q shows a top-view configuration with conductive regions 12 and dielectric regions 22.

Figure 8R:
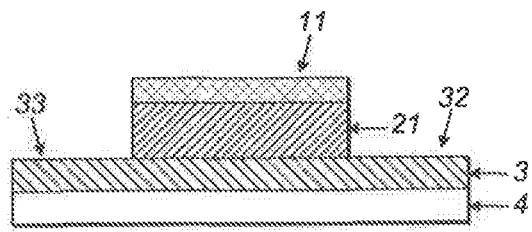
Figure 8S:
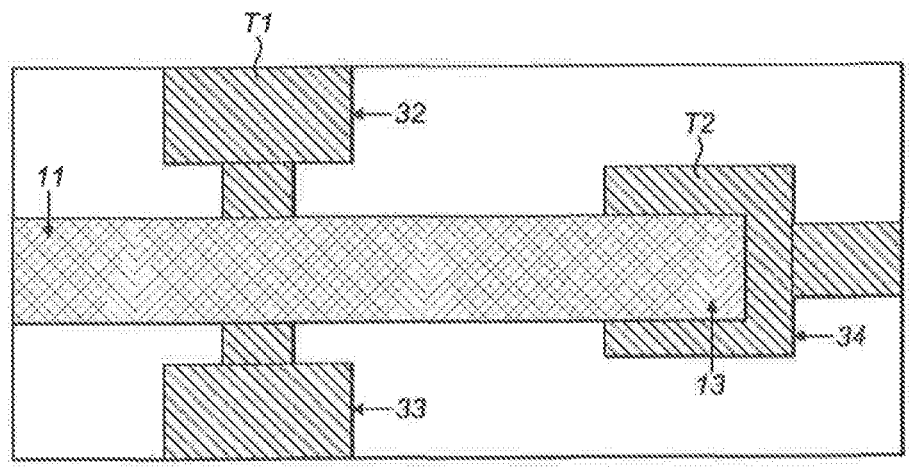

FIG. 8R shows a further stage where dielectric region 22 has been completely removed, to leave a region 21 of dielectric material 2 beneath conductive layer 11, and expose regions 32, 33 and 34 of semiconductive material 3. FIG. 8S shows a top-view of the configuration include region 34.

Figure 8T:
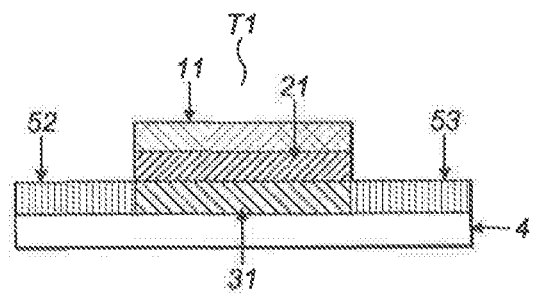
Figure 8U:
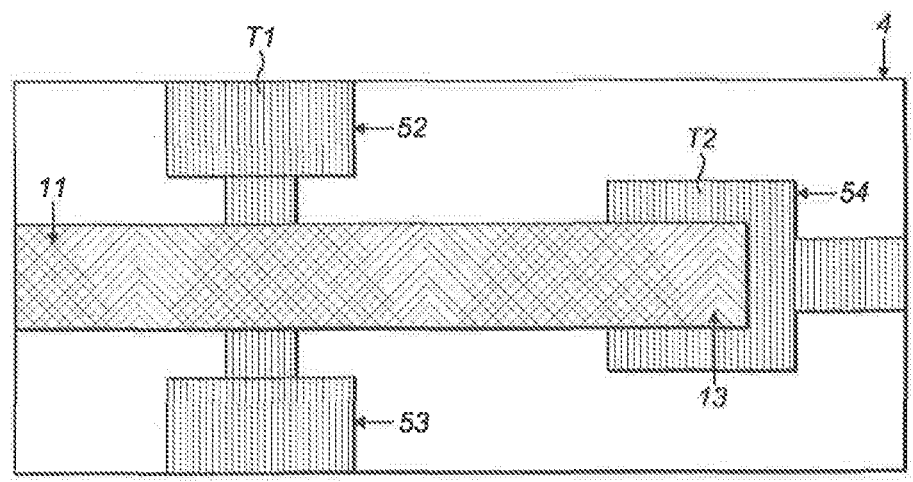

FIG. 8T shows a final stage after further processing to change the properties of the exposed semiconductive regions 32, 33 and 34, for example using excimer laser annealing or plasma treatment, such that their conductivity is substantially increased relative to enclosed layer 31, and they have been converted to conductive regions 52, 53 and 54. The device T1 is now a thin-film transistor. FIG. 8U shows a top-view of the final structure connecting devices T1 and T2.

Figure 9A:
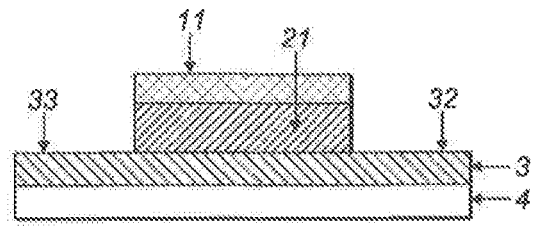
FIGS. 9A-9D illustrates another circuit embodying the invention and processes to fabricate a circuit in another embodiment of the invention.
Figure 9B:
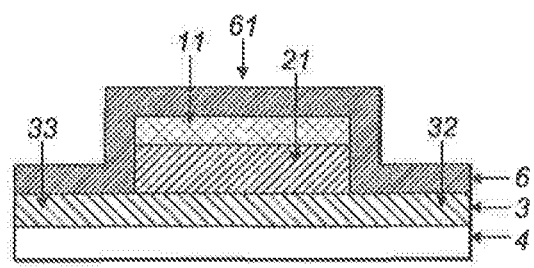

Referring now to FIG. 9A this shows the same device as FIG. 8R. FIG. 9B shows a subsequent stage in which a layer of insulative material 6 has deposited over the substrate, to create insulative region 61.

Figure 9C:
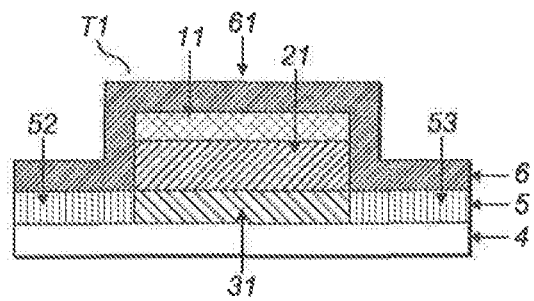
Figure 9D:
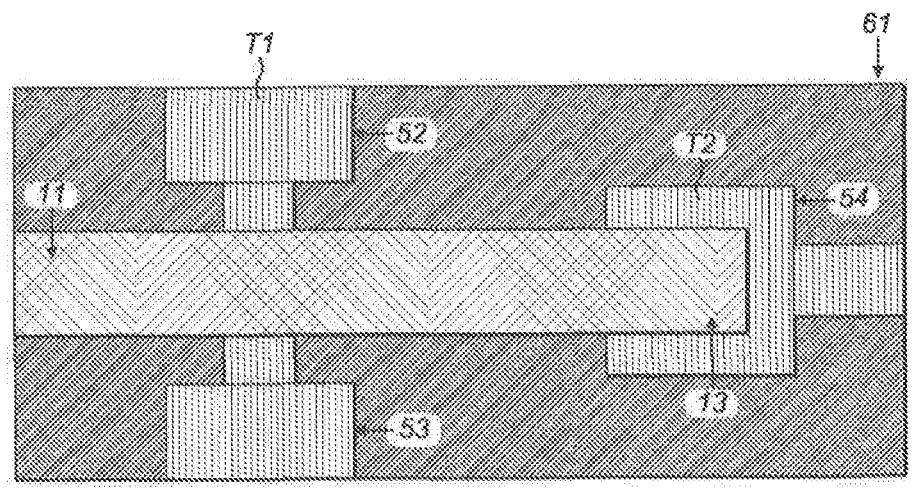
Figure 10:
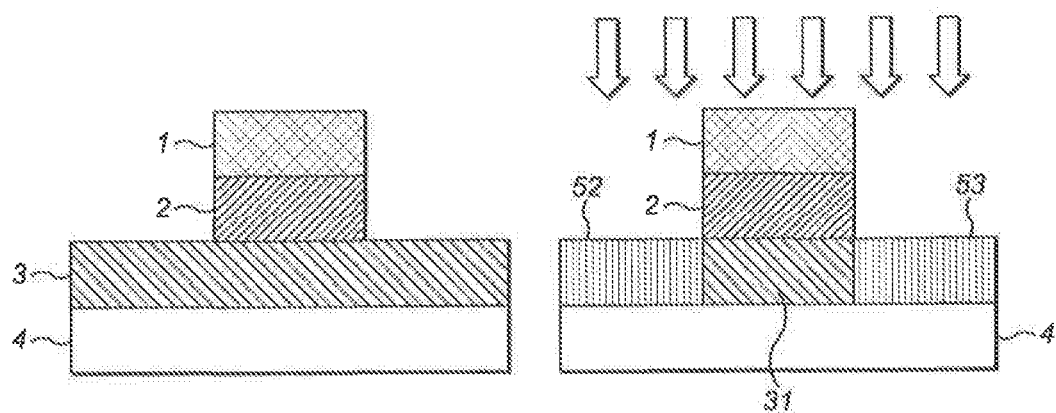
FIG. 10 illustrates steps in the manufacture of another electronic device embodying the invention.

FIG. 9C shows a further stage after further processing to change the properties of the semiconductive regions 32, 33 and 34 such that their conductivity is substantially increased relative to enclosed layer 31, and they have been converted to conductive regions 52, 53 and 54. Insulative region 61 is completely transparent to the treatment, e.g. excimer laser annealing. The device T1 is now a thin-film transistor. FIG. 9D shows a top-view of the final structure connecting devices T1 and T2.

Example materials for use in the embodiments described above include:

Layer 1: aluminium, gold, molybdenum
Layer 2: polymer dielectric, $Al_2O_3$, $SiO_2$, $HfO_2$
Layer 3: metal-oxide semiconductor, e.g. ZnO, ZTO, GIZO, ZITO
Layer 6: $Al_2O_3$, $SiO_2$, $HfO_2$ Certain embodiments provide methods for manufacturing self-aligned transistors. A technique employed in certain embodiments (for top gate devices) is to laser irradiate the semiconductor (IGZO) to change it from semiconducting to conducting and thus form the source-drain contacts. The channel region is protected by the gate electrode and is not irradiated, leaving it in a semiconducting state and hence a self-aligned structure can be formed.

Certain methods, embodying the invention, have been performed using an excimer laser to irradiate samples with wavelengths of 193 nm and 248 nm. Due to short gas lifetimes, excimer lasers are relatively expensive and so alternative embodiments use more commercially attractive lasers such as a Nd:YAG. Solid states lasers—such as a Nd:YAG—produce light at longer wavelengths: 266 nm, 355 nm, 532 nm and 1064 nm. In general, wavelength is selected so as to have sufficient penetration depth in the semiconductor layer (e.g. IGZO) to convert it from semi-conducting to conducting. The above wavelengths have been trialled, using a Nd:YAG at NTU on various samples to investigate conversion from semi-conductor to a conductor and ablation of the dielectric layer on device structures.

Figure 11:
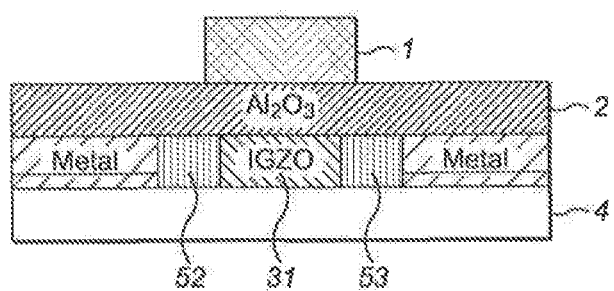
FIG. 11 illustrates another device embodying the invention.

Fluence trials have been carried out on a wafer (50 nm IGZO on SiSiO$_2$). The sample was marked with a grid pattern then irradiated with different fluencies (ranging from 50 to 450 mJ/cm2 at the three wavelengths (355 nm, 266 nm, and 532 nm). Different numbers of pulses were also employed, e.g. 1, 2, 3, and 4. A pulse width from the Nd:YAG laser (~6 ns) was four times shorter than that from the excimer laser (~25 ns). The sheet resistance of the irradiated squares were then measured using a four point probe. From this, the most effective fluence (at converting the semi-conductor) at a given wavelength was used to irradiate device areas on a sample having the structure shown in FIG. 11 to determine how the longer wavelengths affect ablation of the device layers and how the conversion of the semi-conductor is affected by the presence of contact and dielectric layers. Referring to the sample of FIG. 11, the substrate is Si/SiO$_2$ and the IGZO and ALD alumina layers are both 50 nm thick. The source and drain contacts were made from Ti/Au and the gate from 100 nm of aluminium. It should be noted that having the contacts on top of the IGZO instead of underneath, in alternative embodiments, may produce different results.

Sheet resistance of the IGZO film after irradiation at different wavelengths for a range of fluencies was compared. In certain embodiments, to be considered "conducting" a resistivity of around 1 kΩ/sq is acceptable. At both 266 nm and 355 nm a similar resistivity to that at 248 nm (~2-4 kΩ/sq) could be achieved using fluencies of 120 mJ/cm$^2$ and 160 mJ/cm$^2$ respectively.

An issue addressed by certain embodiments is ablation of the dielectric layers due to the laser annealing process. Different wavelengths affect different layers in the device structure. In certain embodiments, a wavelength that does least damage to the alumina layer may be a wavelength that is less effective at converting the semi-conductor to a conductor, e.g. 532 nm. This behaviour could be because a lower amount of energy absorbed by the IGZO would mean less energy is propagated into ablating the alumina.

With regard to source-drain ablation, it has been observed in alternative embodiments that molybdenum contacts adhere better that Ti/Au contacts. Ablation problems may therefore be resolved by using Mo contacts.

Trials of methods embodying the invention have determined that it is possible to convert IGZO from a semi-conductor to a conductor at fluencies of 120 and 160 mJ/cm$^2$ for both 266 nm and 355 nm respectively. At 266 nm and 355 nm the ablation damage is similar to that seen at 248 nm. At 532 nm reduced ablation of the alumina layer has been observed and it appears to stay intact over the important areas i.e. the channel area.

Certain embodiments of the invention address both the conversion of the semi-conductor to conductor and the adhesion of the device layers to each other/the substrate, especially adhesion of the alumina to the IGZO. Certain embodiments use a large laser spot size (~7 mm×7 mm) to irradiate many devices at the same time. However, in alternative embodiments, scanning lasers at 355 nm and 532 nm and smaller spot sizes may be combined with a slower more accurate anneal to reduce ablation.

Certain embodiments use laser radiation at 248 nm. However, the absorption of the film is higher at 193 nm and so this has been investigated in alternative embodiments to understand the influence of wavelength (penetration depth) on conductivity. By extrapolating the absorption characteristics of IGZO to lower wavelengths the penetration depth at 193 nm is approximately 26 nm. This about half what it is at 248 nm.

Certain embodiments use a 193 nm laser producing a square spot with a top hat profile that is spatially uniform. Devices for processing may be positioned using an automatic x-y translation stage. The pulse width may be 25 ns.

Silicon (Si/SiO$_2$ (200 nm)), PEN/SU8 and PEN/SU8/SiO$_2$ structures may be used in certain embodiments. In certain embodiments, the spot size used on the silicon substrates is 10 mm×10 mm, with a fluence of 100 mJ/cm$^2$. On flexible substrates, in alternative embodiments, a spot size of 5 mm×5 mm has been used.

A fluence of 100 mJ/cm$^2$ has been used on 35 nm and 50 nm films on silicon and the number of shots has been varied from one to four. In alternative embodiments, a 20 nm film has been exposed at 75 mJ/cm$^2$ for either one or four shots. In certain embodiments, using flexible substrates, fluences of 50 mJ/cm$^2$ and up to 1×100 mJ/cm$^2$ have been used.

In certain embodiments, 35 nm or 50 nm semiconductor film thicknesses may be used, with laser wavelengths of 193 nm or 248 nm. Certain tests have shown for both film thicknesses the conductivity is improved by using 193 nm rather than 248 nm. For the 50 nm film there is an improvement of a factor of 2 at 1×100 mJ/cm$^2$ reducing to a factor of 1.17 at 4×100 mJ/cm$^2$. For the 35 nm film the improvement is more marked. For the 1×100 mJ/cm$^2$ case there is a 100-fold improvement and at 4×100 mJ/cm$^2$ it is still almost 10 times more conductive that the equivalent 35 nm film irradiated at 248 nm. These results may be explained by the lower penetration depth at 193 nm compared to 248 nm. At a wavelength of 193 nm approximately 74% of the light is absorbed in a 35 nm film compared to only 47% at 248 nm. For a 50 nm film the values are 85% and 60% respectively. Although there may be some benefits to using 193 nm, e.g. at a film thickness of 35 nm, this has to be balanced against the relative ease at which the two laser wavelengths can be implemented in manufacturing. The gas lifetime is worse at 193 nm and equipment is less common than for 248 nm. For a 50 nm film thickness, then 248 nm may be preferable to 193 nm. In certain embodiments, a 50 nm film has been used to make device configurations and it has been possible to deplete the channel and turn the device.

In certain embodiments incorporating flexible substrates, there is less of an impact switching from 248 nm to 193 nm for a 50 nm film thickness at a given laser fluence. However, the higher ablation threshold at 193 nm means that a higher conductivity film is achievable at this wavelength. For example on certain PEN/SU8/SiO$_2$ films the minimum sheet resistance achieved has been 1.5 kΩ/sq for the 193 nm laser and 3.5 kΩ/sq for the 248 nm laser. Improved adhesion of the IGZO to the flexible substrate in alternative embodiments may allow higher fluences to be used at 248 nm.

In certain embodiments 193 nm can be used to convert IGZO from a semiconductor to a conductor.

In certain embodiments, on Si/SiO$_2$ 193 nm produces more conductive films than 248 nm for a given fluence, an effect which is more pronounced the thinner the film.

In certain embodiments employing flexible substrates, for a 50 nm film, the fluence at which the film ablates is higher for 193 nm than for 248 nm. This allows higher fluences to be used to convert the film to a conductor and consequently the maximum conductivity achievable may be higher for 193 nm than for 248 nm.

In certain embodiments, an alumina layer may be employed over the IGZO contacts. The alumina layer may, however, impede conversion of the underlying semiconductor to a conductor. Thus, in certain embodiments the alumina layer may be patterned. Certain embodiments aim to provide an adhesion improvement between the alumina and the IGZO.

Certain embodiments aim to improve the adhesion of the IGZO to a flexible substrate to allow a higher fluence to be used, improve the adhesion of the alumina to the IGZO, and/or improve the adhesion of the IGZO to the substrate.

Certain embodiments address the problem of potential delamination of various layers during the laser annealing process. In certain embodiments, the morphology of the layers is affected through the entire film (structure). For example, TEM images have shown that voids have appeared in an IGZO layer when directly exposed to the laser radiation.

Certain embodiments employ IGZO semiconductor films, for example of thicknesses 35, 50 or 100 nm, on Si/SiO2 substrates. Further embodiments employ foil-on-glass (FoG) substrates. The following two substrate structures were used in certain embodiments:
1) PEN/SU8/SiO$_2$/IGZO
2) PEN/SU8/IGZO The SiO$_2$ interlayer was intended as an intermediate stage between the Si/SiO$_2$ substrate and the PEN/SU8 substrate. Both structures had a 50 nm IGZO film deposited on them. For the PEN/SU8 structure the ablation threshold for the IGZO film was between 50-60 mJ/cm$^2$. The ablation threshold was higher for the PEN/SU8/SiO$_2$ structure at between 90-100 mJ/cm$^2$. Both are still substantially lower than the threshold for Si/SiO$_2$, which in certain embodiments has begun to show signs of damage (but is still not ablated) above 200 mJ/cm$^2$. A conductivity of around 1 kOhm/sq was achieved on the PEN/SU8/SiO$_2$ structure which is comparable to the conductivities achieved on silicon The processing in different embodiments of the invention may be carried out in different atmospheric conditions. In certain embodiments, the processing may be entirely in air, but different atmospheric conditions may impact the conductivity achievable. For example, a H$_2$N$_2$ environment may improve the conductivity of the film and using an oxygen environment may increase the resistivity. This may be explained by the fact that the carrier transport in IGZO is through oxygen vacancies. In a nitrogen environment the oxygen is removed and therefore conduction is easier whilst in an oxygen rich environment the vacancies are removed and the conduction drops.

Figure 12:
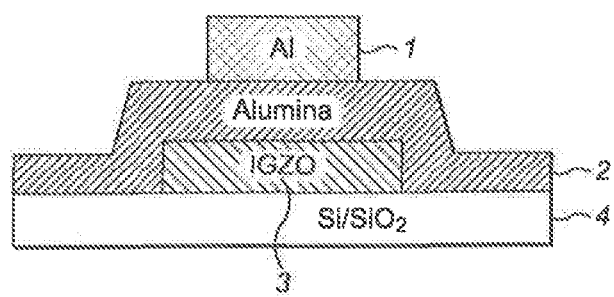
FIG. 12 illustrates a structure for processing to manufacture a device embodying the invention.

FIG. 12 illustrates a structure used in certain embodiments. This structure lends itself to use with laser irradiation. To counteract the potential problem of a dielectric layer (alumina) not adhering well to the semiconductor, a blanket layer of alumina was used which adhered sufficiently well to the surrounding SiO$_2$ that the device remained intact.

The gate metal was also chosen by performing fluence trials on an alumina/metal stack. Ti/Au, Mo and Al were investigated and it was found that Al had the highest ablation threshold and this was then chosen as the gate metal. The resultant device stack is shown in FIG. 12. Certain embodiments have been produced with a patterned gate dielectric and a blanket passivation layer encapsulating the whole device.

In certain embodiments, it is desirable to give some leeway as to the positioning of the gate, in order to accommodate distortion in underlying flexible substrates, for example. After a few 10 ums metal contacts will be present in order to pass the current to other parts of the circuit. Therefore certain embodiments make transistors which have metal contacts near to but not abutting a transistor, such as those shown in FIG. 11.

In certain embodiments, the laser exposure causes a negative threshold shift, e.g. approximately −1.2V to −1.7V. This could result from an increase in positive trapped charge at the interface or within the dielectric. There is an improvement in the sub-threshold slope which suggests that the total trapped charge (i.e. that in the dielectric and the semiconductor and at the interface combined) has been reduced. This may imply that the semiconductor has had trap states removed. Alternatively, the carrier concentration in the semiconductor may have increased. This could occur if the laser processing removes oxygen thereby increasing the number of oxygen vacancy sites.

Figure 13:
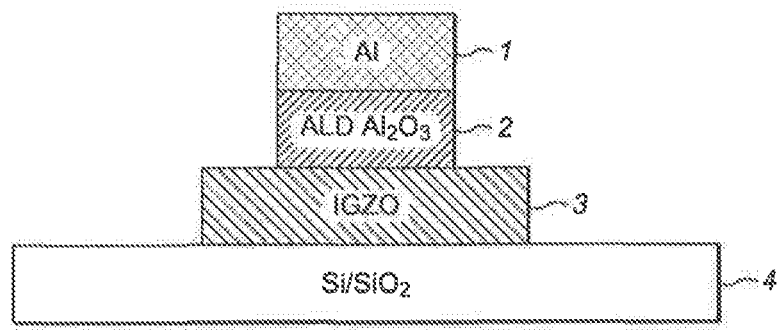
FIG. 13 illustrates another structure for processing to manufacture a device embodying the invention.
Figure 14A:
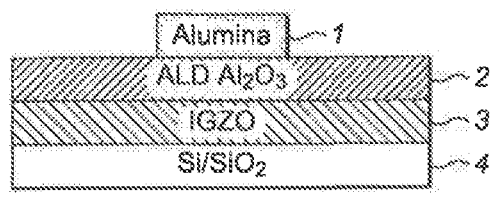
FIGS. 14A-14B illustrates further structures for processing to manufacture devices embodying the invention.
Figure 14B:
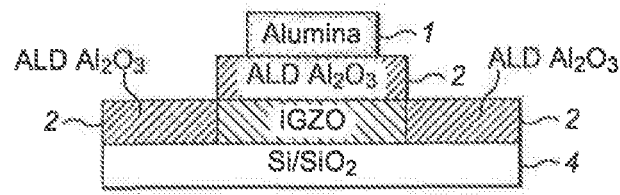

FIGS. 13 and 14A shows further device structures that may be laser annealed in embodiments of the invention to produce transistors having source and drain terminals of increased conductivity (as compared with their channels, under the Al gates.

The invention claimed is:

1. A method of manufacturing an electronic device, the method comprising:
providing a layer of semiconductor material comprising a first portion, a second portion, and a third portion, the third portion connecting the first portion to the second portion and providing a semiconductive channel for electrical current flow between the first and second portions;
providing a gate terminal arranged with respect to said third portion such that a voltage may be applied to the gate terminal to control an electrical conductivity of said channel, wherein providing said gate terminal comprises:
forming a covering of resist material over the layer of semiconductor material;
forming a window in said covering to expose said third portion;
depositing a layer of dielectric material at least inside said window to cover said third portion;

depositing a layer of conductive material at least inside said window to cover the layer of dielectric material inside the window; and removing remaining material of said covering of resist material so as to expose the first and second portions of the layer of semiconductor material, whereby the layer of conductive material covering the layer of dielectric material covering the third portion provides said gate terminal; and processing at least one of the first and second portions so as to have an electrical conductivity greater than an electrical conductivity of the channel when no voltage is applied to the gate terminal.

2. A method in accordance with claim 1, wherein said processing comprises exposing at least one of the first and second portions to electromagnetic radiation.

3. A method in accordance with claim 1, wherein said processing comprises exposing both of the first and second portions to said electromagnetic radiation at the same time.

4. A method in accordance with claim 2, wherein said electromagnetic radiation is laser radiation.

5. A method in accordance with claim 4, wherein said laser is an excimer or an exciplex laser.

6. A method in accordance with claim 2, wherein said exposing comprises exposing said portion or portions to a pulse of said electromagnetic radiation.

7. A method in accordance with claim 6, wherein said exposing comprises exposing said portion or portions to a series of pulses of said electromagnetic radiation.

8. A method in accordance with claim 2, wherein said electromagnetic radiation substantially comprises electromagnetic radiation having a wavelength in the range 100 nm to 1000 nm.

9. A method in accordance with claim 2, further comprising providing a layer of electrically insulative material covering at least the first and second portions, wherein said processing comprises exposing at least one of the first and second portions to said electromagnetic radiation through said layer of electrically insulative material.

10. A method in accordance with claim 9, wherein said layer of electrically insulative material also covers the third portion and provides a gate dielectric.

11. A method in accordance with claim 1, wherein said processing comprises laser annealing.

12. A method in accordance with claim 1, wherein the electronic device is a transistor.

13. A method in accordance with claim 1, wherein the electronic device is a thin film transistor.

14. A method in accordance with claim 13, wherein the layer of semiconductor material is at least substantially transparent to visible light.

15. A method in accordance with claim 1, further comprising supporting said layer of semiconductor material directly or indirectly on a substrate.

16. A method in accordance with claim 1, wherein providing said layer of semiconductor material comprises forming said layer by a technique selected from a list comprising: printing, spin coating, vapor deposition, vacuum deposition, coating, pulsed-laser deposition (PLD), and atomic-layer deposition (ALD) coating.

17. A method in accordance with claim 1, further comprising using said gate terminal as a mask to shield said channel at least partly from said processing of at least one of the first and second portions.

18. A method in accordance with claim 1, wherein the third portion has a width and said channel extends fully across said width such that current flow from the first portion to the second portion via the third portion is via said channel.

19. A method in accordance with claim 1, wherein forming said window comprises forming a depression in the covering of resist material and removing resist material at least from a base of said depression to expose said third portion.

20. A method in accordance with claim 19, wherein forming said depression comprises forming said depression by imprinting each feature being adapted to produce a respective depression having a respective depth.

21. A method in accordance with claim 1, wherein said window is arranged to have a width greater than a width of the third portion such that said window extends beyond edges of the third portion.

22. A method in accordance with claim 1, further comprising forming an undercut in said window before forming said layer of dielectric material.

23. A method in accordance with claim 1, further comprising forming an undercut in said window after forming said layer of dielectric material so as to expose at least one further portion of the surface of the semiconductor layer adjacent the layer of dielectric material inside the window.

24. A method in accordance with claim 22, further comprising extending said undercut after forming said layer of dielectric material so as to expose at least one further portion of the surface of the semiconductor layer adjacent the layer of dielectric material inside the window.

25. A method in accordance with claim 8, wherein the wavelength is at least one of 248 nm, 266 nm, 355 nm, or 532 nm.

26. A method in accordance with claim 20, wherein forming said depression by imprinting comprises imprinting with an imprint tool having a plurality of imprint features.

27. A method in accordance with claim 20, wherein the coating comprises at least one of spin, dip, blade, bar, spray, slot-die.

* * * * *